(12) United States Patent
Yang et al.

(10) Patent No.: US 11,186,481 B2
(45) Date of Patent: Nov. 30, 2021

(54) SENSOR DEVICE AND MANUFACTURING METHOD THEREOF

(71) Applicant: TAIWAN SEMICONDUCTOR MANUFACTURING CO., LTD., Hsinchu (TW)

(72) Inventors: Chen Hsiung Yang, Hsinchu County (TW); Chun-Wen Cheng, Hsinchu County (TW); Jiou-Kang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 284 days.

(21) Appl. No.: 16/179,644

(22) Filed: Nov. 2, 2018

(65) Prior Publication Data
US 2019/0162753 A1  May 30, 2019

Related U.S. Application Data

(60) Provisional application No. 62/593,025, filed on Nov. 30, 2017.

(51) Int. Cl.
*H01L 41/29* (2013.01)
*B81C 1/00* (2006.01)
(Continued)

(52) U.S. Cl.
CPC .......... *B81C 1/00158* (2013.01); *B81B 5/00* (2013.01); *B81C 1/00166* (2013.01); *G01L 1/18* (2013.01);
(Continued)

(58) Field of Classification Search
None
See application file for complete search history.

(56) References Cited

U.S. PATENT DOCUMENTS

| 5,567,880 A | * | 10/1996 | Yokota | G01P 15/123 |
|---|---|---|---|---|
| | | | | 257/E27.006 |
| 8,468,888 B2 | | 6/2013 | Wu et al. | |

(Continued)

FOREIGN PATENT DOCUMENTS

| JP | H10132682 A | 5/1998 |
|---|---|---|
| JP | WO2015/115365 A1 | 3/2017 |

(Continued)

OTHER PUBLICATIONS

Notice of Allowance issued in corresponding Korean Patent Application No. 10-2018-0152004, dated Jun. 29, 2020.
(Continued)

*Primary Examiner* — Benjamin P Sandvik
(74) *Attorney, Agent, or Firm* — McDermott Will & Emery LLP

(57) ABSTRACT

A sensor device includes a microelectromechanical system (MEMS) force sensor, and a capacitive acceleration sensor. In the method of manufacturing the sensor device, a sensor portion of the MEMS force sensor is prepared over a front surface of a first substrate. The sensor portion includes a piezo-resistive element and a front electrode. A bottom electrode and a first electrode are formed on a back surface of the first substrate. A second substrate having an electrode pad and a second electrode to the bottom of the first substrate are attached such that the bottom electrode is connected to the electrode pad and the first electrode faces the second electrode with a space therebetween.

19 Claims, 18 Drawing Sheets

(51) Int. Cl.
   *G01P 15/125* (2006.01)
   *G01P 15/08* (2006.01)
   *G01L 1/18* (2006.01)
   *B81B 5/00* (2006.01)
   *H01L 41/25* (2013.01)

(52) U.S. Cl.
   CPC ........ *G01P 15/0802* (2013.01); *G01P 15/125* (2013.01); *H01L 41/25* (2013.01); *H01L 41/29* (2013.01)

(56) References Cited

U.S. PATENT DOCUMENTS

| | | | |
|---|---|---|---|
| 2007/0089514 A1* | 4/2007 | Takeyari | G01P 15/123 73/514.33 |
| 2008/0083962 A1* | 4/2008 | Vaganov | G01L 1/18 257/417 |
| 2010/0312468 A1 | 12/2010 | Withanawasam | |
| 2012/0060605 A1 | 3/2012 | Wu et al. | |
| 2013/0167640 A1* | 7/2013 | Lim | G01P 15/0802 73/514.01 |
| 2013/0205899 A1* | 8/2013 | Wu | B81B 7/02 73/510 |
| 2013/0277774 A1* | 10/2013 | Frey | B81C 1/00238 257/415 |
| 2015/0360935 A1* | 12/2015 | Grabmaier | B81C 1/00238 257/415 |
| 2016/0341759 A1 | 11/2016 | Yamaji et al. | |
| 2017/0066646 A1* | 3/2017 | Cheng | B81C 1/00182 |

FOREIGN PATENT DOCUMENTS

| | | |
|---|---|---|
| KR | 10-2005-0063097 A | 6/2005 |
| KR | 20100130561 A | 12/2010 |
| KR | 10-2015-0090629 A | 8/2015 |

OTHER PUBLICATIONS

Piezoresistive Pressure and Temperature Sensor Cluster, Retrieved from the Internet http://www.microsystems.metu.edu.tr/piezops/piezops.html on Nov. 2, 2018.

* cited by examiner

US 11,186,481 B2

SENSOR DEVICE AND MANUFACTURING METHOD THEREOF

RELATED APPLICATIONS

This application claims priority of U.S. Provisional Patent Application No. 62/593,025 filed Nov. 30, 2017, the entire contents of which are incorporated herein by reference.

BACKGROUND

Micro-electro mechanical system (MEMS) devices have recently been developed. MEMS devices include devices fabricated using semiconductor technology to form mechanical and electrical features. The MEMS devices are implemented in pressure sensors, microphones, actuators, mirrors, heaters, and/or printer nozzles. Although existing devices and methods for forming the MEMS devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, at least one of A, B and C means "A," "B," "C," "A and B," "A and C," "B and C," or "A, B and C," and does not mean that one from A, one from B and one from C, unless otherwise indicated.

Figure 1A:
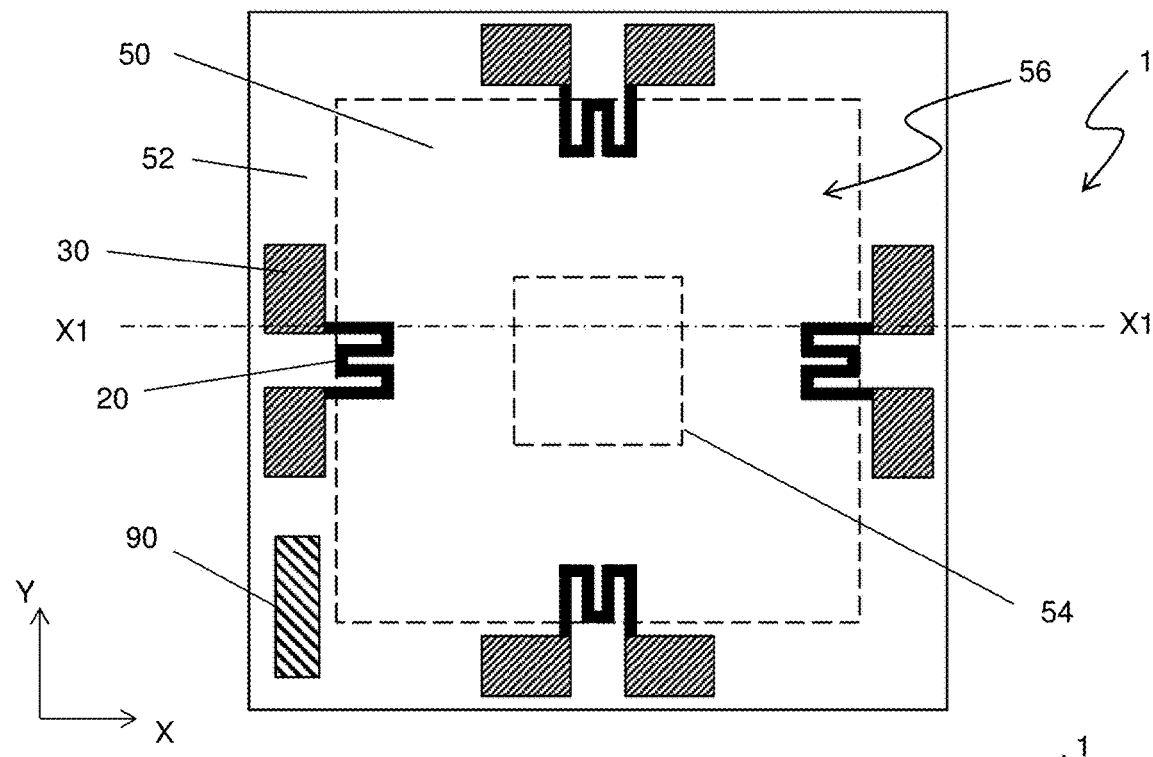
FIGS. 1A and 1B show a schematic view of a sensor device according to an embodiment of the present disclosure.
Figure 1B:
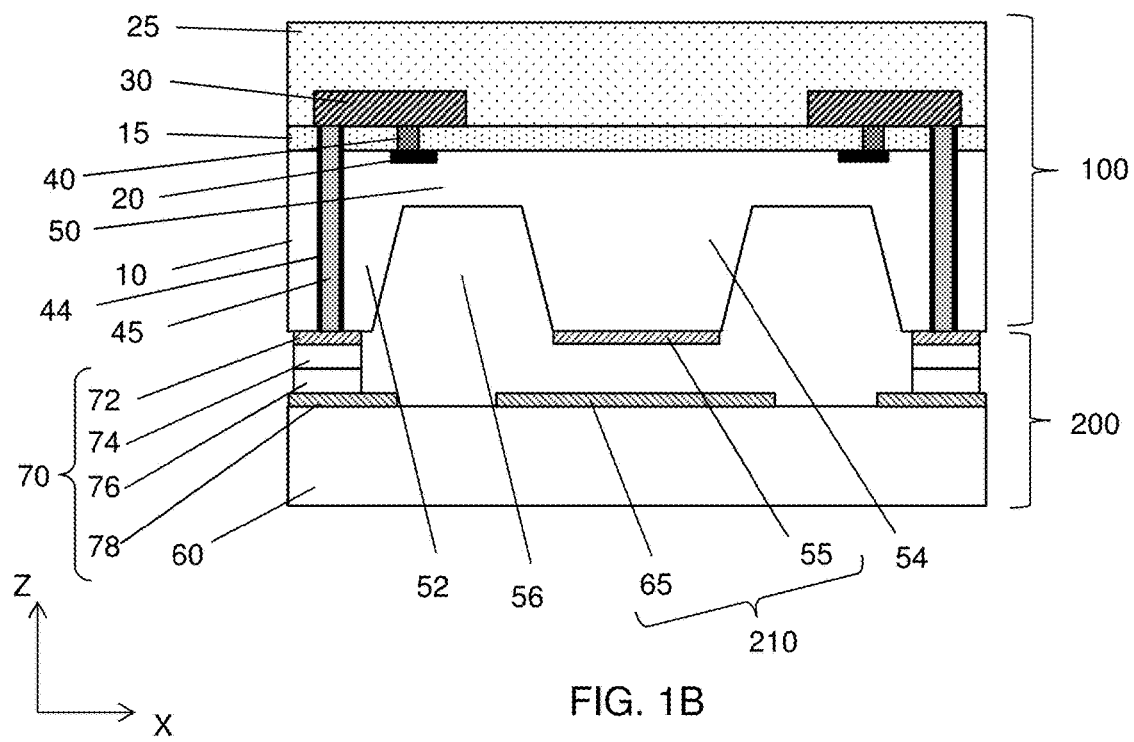

FIGS. 1A and 1B show a schematic view of a sensor device according to an embodiment of the present disclosure. FIG. 1A shows a plan view (viewed from above) and FIG. 1B shows a cross sectional view corresponding to line X1-X1 of FIG. 1A.

As shown in FIGS. 1A and 1B, a sensor device 1 according to an embodiment of the present disclosure includes a microelectromechanical system (MEMS) sensor 100 and a capacitive sensor 200. In some embodiments, the MEMS sensor 100 is a pressure sensor. In other embodiments, the MEMS sensor 100 is a microphone. In some embodiments, the capacitive sensor 200 is an accelerometer. In other embodiments, the capacitive sensor 200 is a touch sensor.

In some embodiments, the MEMS sensor 100 is a piezo-resistive force sensor. The piezo-resistive force sensor 100 includes a frame portion 52, a membrane portion (e.g., a diaphragm) 50, a piezo-resistive element 20 disposed in the membrane portion 50, and a cavity 56 disposed below the membrane portion 50 and surrounded by the frame portion 52, as shown in FIGS. 1A and 1B. In some embodiments, the piezo-resistive force sensor 100 further includes a center weight portion 54 surrounded by the cavity 56, as shown in FIGS. 1A and 1B. The frame portion 52, the membrane portion 50 and the center weight portion 54 may be collectively referred to as a MEMS substrate.

The piezo-resistive force sensor 100 further includes a first insulating layer 15 formed on the upper surface of the MEMS substrate, a second insulating layer 25 formed on the first insulating layer 15, one or more front wiring patterns (e.g., electrodes) 30 and one or more via conductors 40 connecting the piezo-resistive element 20 and the front wiring pattern 30, in some embodiments.

As shown in FIG. 1A, the piezo-resistive force sensor 100 includes four piezo-resistive elements 20. The cavity 56 is sealed to form a closed space. When the pressure outside the piezo-resistive force sensor 100 differs from the pressure inside the cavity 56, the membrane portion 50 deforms. The deformation of the membrane portion 50 causes a change in the resistance of the piezo-resistive elements 20. The four piezo-resistive elements 20 are electrically connected to form a Wheatstone bridge, and the change in resistance corresponds to the pressure applied which is measured using the Wheatstone bridge. In some embodiments, an amplifying circuit (e.g., transistors) is integrated into the piezo-resistive force sensor 100 to output a signal corresponding to the applied pressure. In other embodiments, the piezo-resistive force sensor 100 is a microphone and the cavity 56 is not sealed.

In some embodiments, the MEMS substrate is made of a semiconductor material, such as silicon. In some embodiments, the silicon substrate is a heavily doped silicon substrate doped with P, As and/or, Sb (n-type) or B (p-type). A thickness of the membrane portion 50 is in a range from about 1 µm to 100 µm in some embodiments, and is in a rage from about 5 µm to 50 µm in other embodiments. The piezo-resistive element 20 is formed by a doped region at the membrane portion 50 of the MEMS substrate.

As shown in FIG. 1B, the capacitive sensor 200 includes a capacitor 210 formed by a first electrode 55 and a second electrode 65. A space between the first electrode 55 and the second electrode 65 is in a range from about 0.5 µm to about 2 µm in some embodiments, and is in a range from about 0.8 µm to about 1.2 µm in other embodiments.

In some embodiments, the capacitive sensor 200 is an accelerometer that detects acceleration. The capacitive sensor 200 detects a displacement of the weight portion 54 as a change in a capacitance value when a force is applied to the weight portion 54. By using an equation a=F/m=kx/m, where a is acceleration, F is force, k is a spring constant (stiffness of the membrane portion), x is the displacement and m is a mass of the weight portion 54, the acceleration can be calculated.

In some embodiments, the second electrode 65 is disposed on a main surface of a capacitive sensor side substrate 60, as shown in FIG. 1B. One or more capacitive sensor side electrodes 78 are also disposed on the main surface of the capacitive sensor side substrate 60. The second electrode 65 is electrically coupled to one of the capacitive sensor side electrodes 78 in some embodiments. Further, an electrode pad 76 is disposed on the capacitive sensor side electrode 78.

In the MEMS substrate, a bottom electrode 72 is disposed on the bottom surface of the frame portion 52. In some embodiments, an electrode pad 74 is disposed on the bottom electrode 72, as shown in FIG. 1B. Further, a conductive connector 45 passes through the frame portion 52 is provided to electrically connect the front wiring pattern 30 and the bottom electrode in some embodiments. When the MEMS substrate is formed by doped silicon having a low resistivity, an insulating layer 44 is disposed between the conductive connector and the frame portion 52. In some embodiments, the conductive connector 45 includes a metallic material. In other embodiments, the conductive connector 45 is a silicon pillar made of a part of the semiconductor material of the frame portion 52 surrounded by an insulating layer 44.

As shown in FIG. 1B, the electrode pad 74 formed on the bottom of the piezo-resistive force sensor 100 is connected to the electrode pad 76 formed on the main surface of the capacitive sensor side substrate 60. In some embodiments, the electrode pad 72 and the electrode pad 74 are connected by eutectic bonding. The bottom electrode 72, the electrode pad 74, the electrode pad 76 and the capacitive sensor side electrode 78 constitute a connection electrode 70 connecting the MEMS substrate and the capacitive sensor side substrate 60.

In some embodiments, as shown in FIG. 1A, an electronic circuit 90 is disposed on the piezo-resistive force sensor 100. The electronic circuit 90 includes, for example, an amplifier, a signal processor and/or an I/O circuit. The electronic circuit is electrically coupled to the piezo-electric elements of the piezo-resistive force sensor 100 and the capacitive sensor 200 and receives a signal from the piezo-resistive force sensor 100 and a signal from the capacitive sensor 200. In some embodiments, the electronic circuit 90 is a semiconductor device formed in the semiconductor MEMS substrate. In other embodiments, the electronic circuit 90 is an integrated circuit (IC) separately manufactured from and attached to the MEMS substrate.

According to the sensor device 1, pressure applied to the membrane and acceleration (force) can be measured by one device.

Figure 2A:
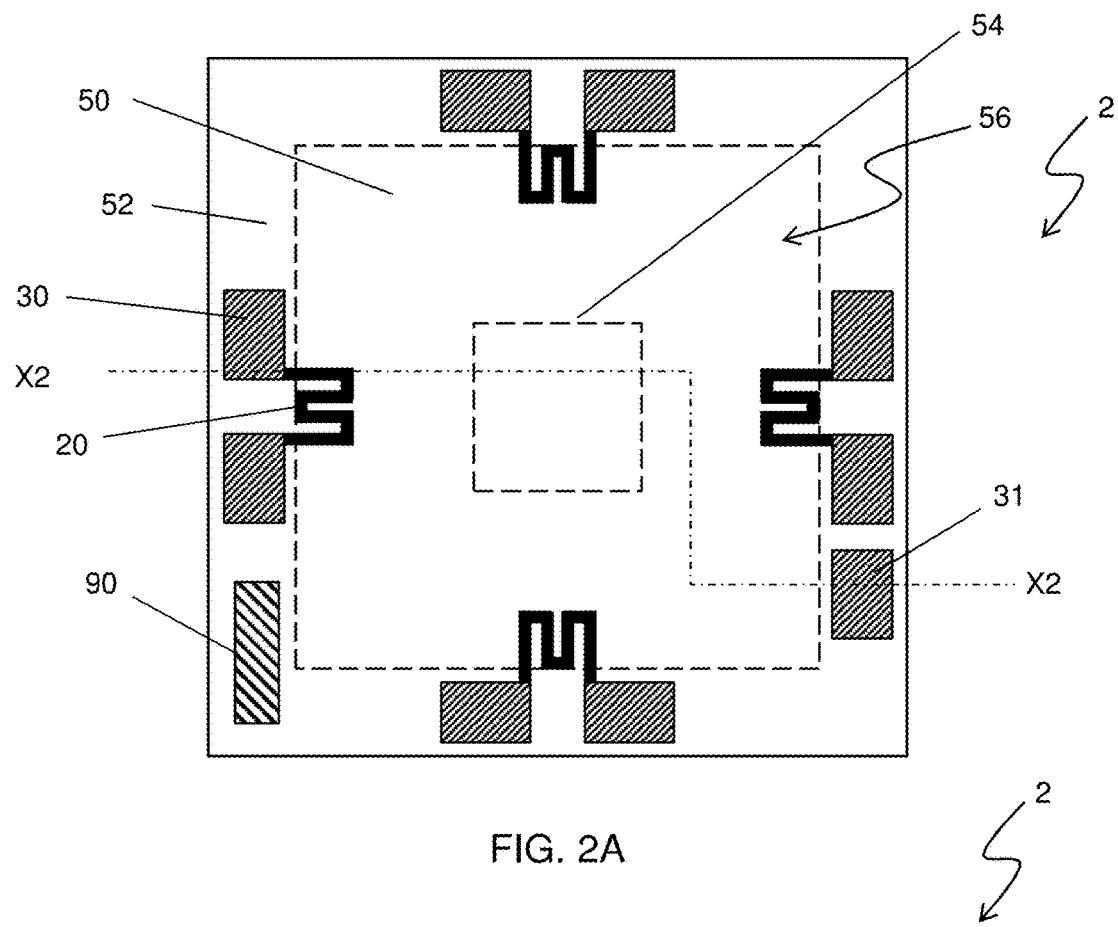
FIGS. 2A and 2B show a schematic view of a sensor device according to an embodiment of the present disclosure.
Figure 2B:
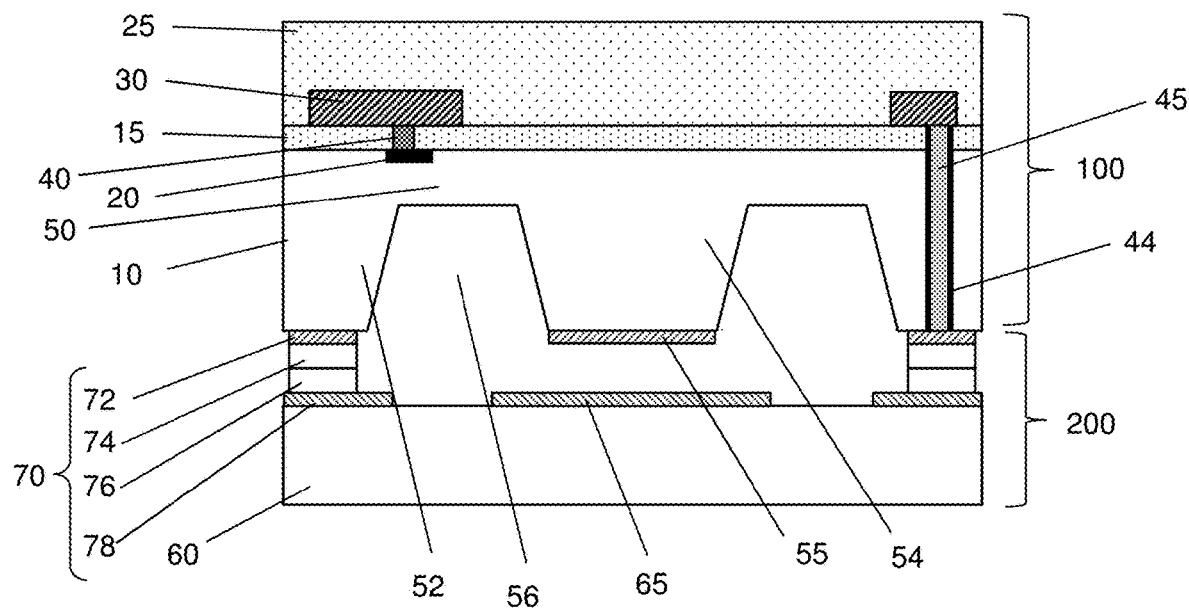

FIGS. 2A and 2B show a schematic view of a sensor device 2 according to another embodiment of the present disclosure. FIG. 2A shows a plan view (viewed from above) and FIG. 2B shows a cross sectional view corresponding to line X2-X2 of FIG. 1A. Material, configuration, dimensions and/or processes the same as or similar to the foregoing embodiments described with FIGS. 1A and 1B may be employed in the following embodiments, and detailed explanation thereof may be omitted.

In FIGS. 1A and 1B, the capacitive sensor side electrode 78 is electrically connected, via the conductive connector 45, to the front wiring pattern 30 connected to the piezo-resistive element 25 via the via conductor 40. In the embodiment of FIGS. 2A and 2B, the capacitive sensor side electrode 78 is electrically connected, via the conductive connector 45, to the front wiring pattern 31, which is not connected to the piezo-resistive element 25 via the via conductor 40. The front wiring pattern 31 is electrically connected to the electronic circuit 90 in some embodiments.

Figure 3:
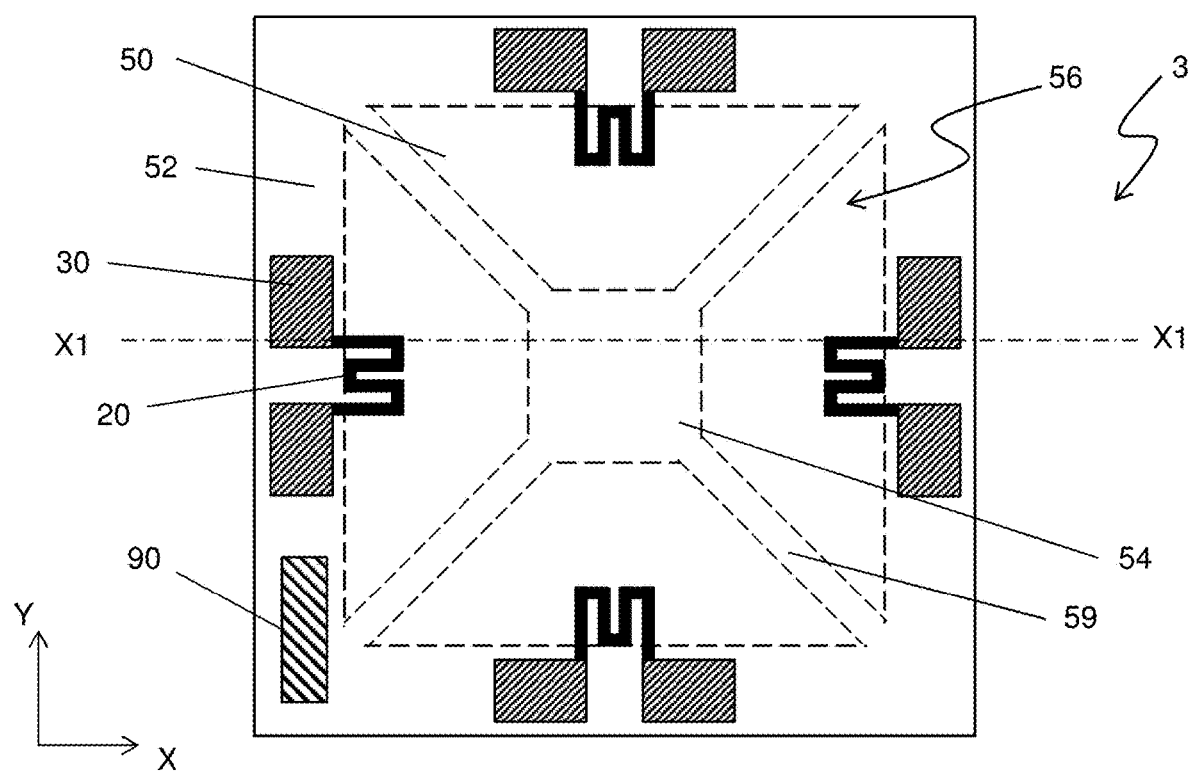
FIG. 3 shows a schematic view of a sensor device according to an embodiment of the present disclosure.

FIG. 3 shows a schematic view of a sensor device 3 according to another embodiment of the present disclosure. Material, configuration, dimensions and/or processes the same as or similar to the foregoing embodiments described with FIGS. 1A-2B may be employed in the following embodiments, and detailed explanation thereof may be omitted.

In the embodiment of FIG. 3, the weight portion 54 is supported by the membrane portion and beams 59. The thickness of the beams 59 is substantially the same as the thickness of the weight portion 54 in some embodiments. In other embodiments, the thickness of the beams 59 is smaller than the thickness of the weight portion 54. The first electrode is disposed on the bottom of the weight portion. In other embodiments, the first electrode is disposed on the bottom of the weight portion 54 and the bottom of the beams 59.

FIGS. 4A-9 show various stages of manufacturing operations for a sensor device in accordance with an embodiment of the present disclosure. It is understood that additional operations can be provided before, during, and after the processes shown by FIGS. 4A-9, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-3 may be employed in the following embodiments, and detailed explanation thereof may be omitted.

Figure 4A:
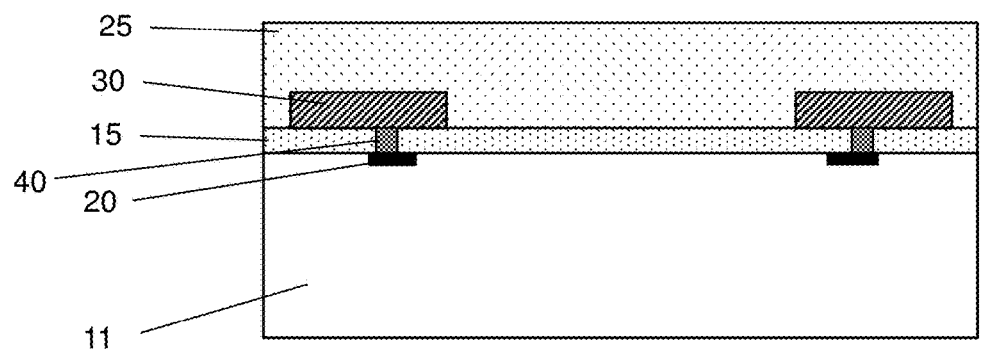
FIGS. 4A and 4B show various stages of a manufacturing operation for a sensor device according to an embodiment of the present disclosure.

FIGS. 4A-7 show various stages of manufacturing operations for a MEMS sensor side structure. As shown in FIG. 4A, surface structures and electrical parts of the piezo-resistive force sensor 100 are fabricated on the MEMS substrate 11. The MEMS substrate 11 is Si in some embodiments. In certain embodiments, the MEMS substrate 11 is p-type Si, and in other embodiments, the MEMS substrate 11 is n-type Si. The thickness of the MEMS substrate 11 is in a range from about 300 µm to about 1000 µm in some embodiments. In certain embodiments, the MEMS substrate is intrinsic Si. The electrical parts include piezo-resistive elements 20, via conductors 40 and front wiring patterns 30, and the surface structures include a first insulating layer 15 and a second insulating layer 25. In some embodiments, the first insulating layer 15 and the second insulating layer 25 include a silicon oxide based material or a silicon nitride based material, such as $SiO_2$, SiN and SiON.

Figure 4B:
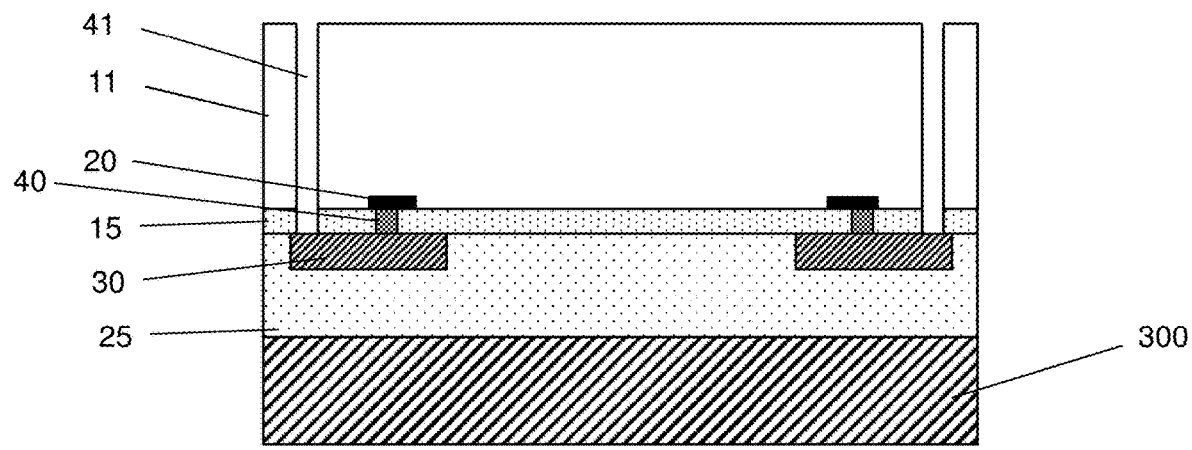

Then, as shown in FIG. 4B, a dummy substrate 300 is attached to the front of the MEMS substrate 11. In some embodiments, the dummy substrate 300 is a Si substrate and bonded to the second insulating layer 25 by fusion bonding.

Figure 5A:
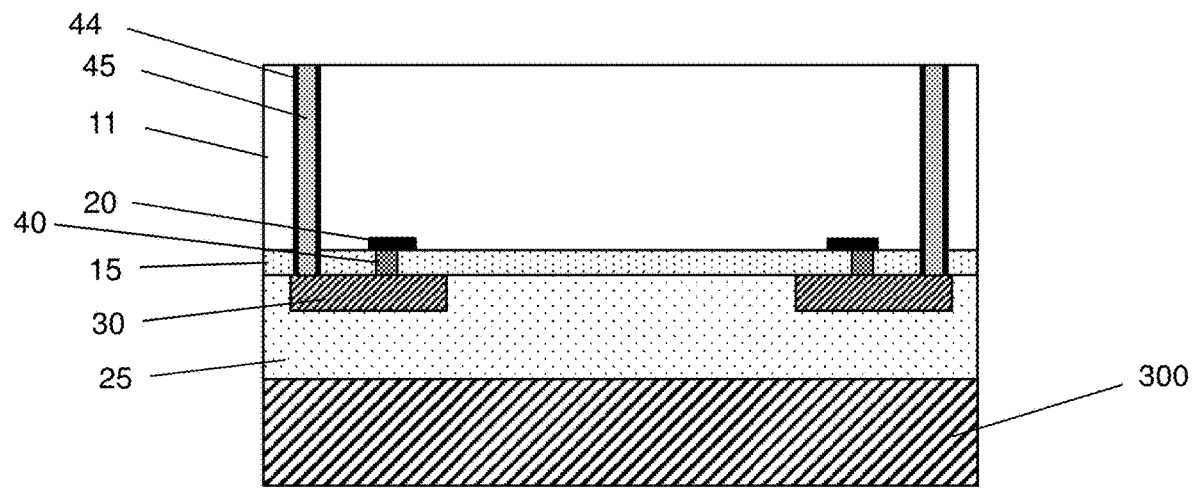
FIGS. 5A and 5B show various stages of a manufacturing operation for a sensor device according to an embodiment of the present disclosure.

After the dummy substrate 300 is attached, a through-hole 41 is formed in the MEMS substrate 11 by using one or more lithography operations and etching operations, as shown in FIG. 4B. Subsequently, an insulating layer 44 is formed on inner wall of the through-hole 41, and a conductive material is filled in the through-hole, thereby forming a conductive connector 45, as shown in FIG. 5A The insulating layer 44 can be formed by chemical vapor deposition (CVD), thermal oxidation or chemical oxidation. The conductive material for the conductive connector 45 includes Al, Cu, W, Ti, TiN, Ta, TaN, or any other suitable material. The conductive material is formed by CVD, physical vapor deposition (PVD) including sputtering or electro plating and a planarization operation, such as chemical mechanical polishing (CMP) is performed to remove excess material formed on the rear surface of the MEMS substrate 11.

Figure 5B:
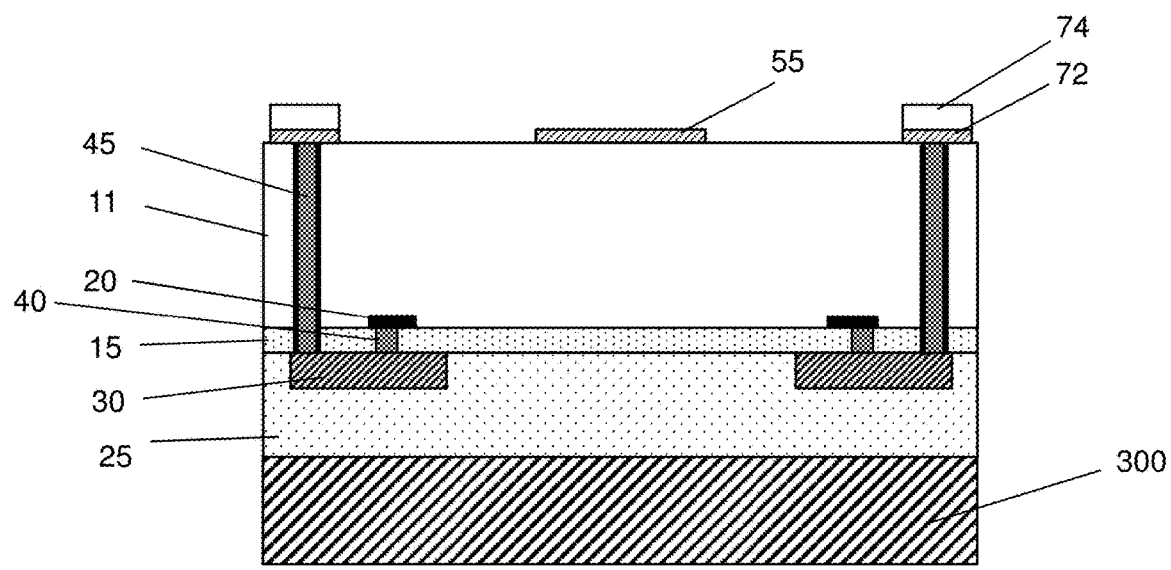

Subsequently, as shown in FIG. 5B, a first electrode 55 for a capacitor of a capacitive sensor 200, a bottom electrode 72 and an electrode pad 74 are formed on the rear surface of the MEMS substrate 11. In some embodiments, a blanket layer of a first conductive layer for the first electrode 55 and the bottom electrode 72 is formed on the rear surface of the MEMS substrate 11 and a blanket layer of a second conductive layer for the electrode pad 74 is formed on the first conductive layer. Then, the second conductive layer is patterned to form the electrode pad 74 by using one or more lithography operations and etching operations, and then the first conductive layer is patterned to form the first electrode 55 and the bottom electrode 72 by using one or more lithography operations and etching operations.

In some embodiments, the first conductive layer for the first electrode 55 and the bottom electrode 72 includes TiN having a thickness in a range from about 50 nm to about 200 nm. The second conductive layer for the electrode pad 74 includes Al, AlCu and/or Cu having a thickness in a range from about 500 nm to 1200 nm in some embodiments. The first and second conductive layers can be formed by CVD, PVD or electro plating.

Figure 6A:
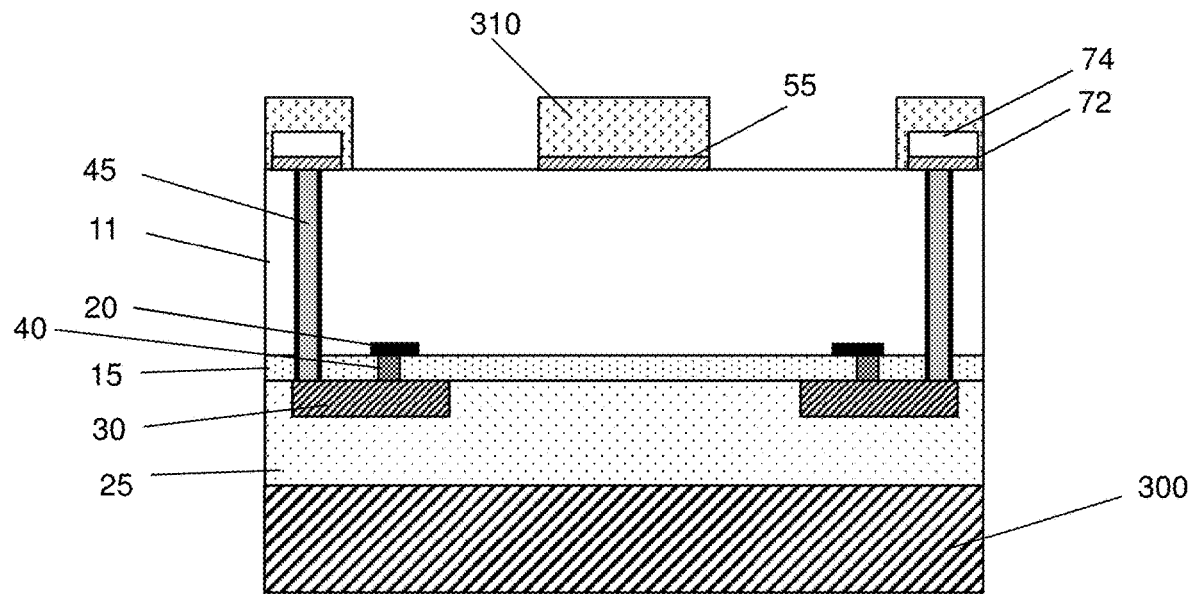
FIGS. 6A and 6B show various stages of a manufacturing operation for a sensor device according to an embodiment of the present disclosure.

Subsequently, a photo resist layer 310 is formed on the rear surface of the MEMS substrate 11 to cover the electrode pad 74, the bottom electrode 72 and the first electrode 55, as shown in FIG. 6A.

Figure 6B:
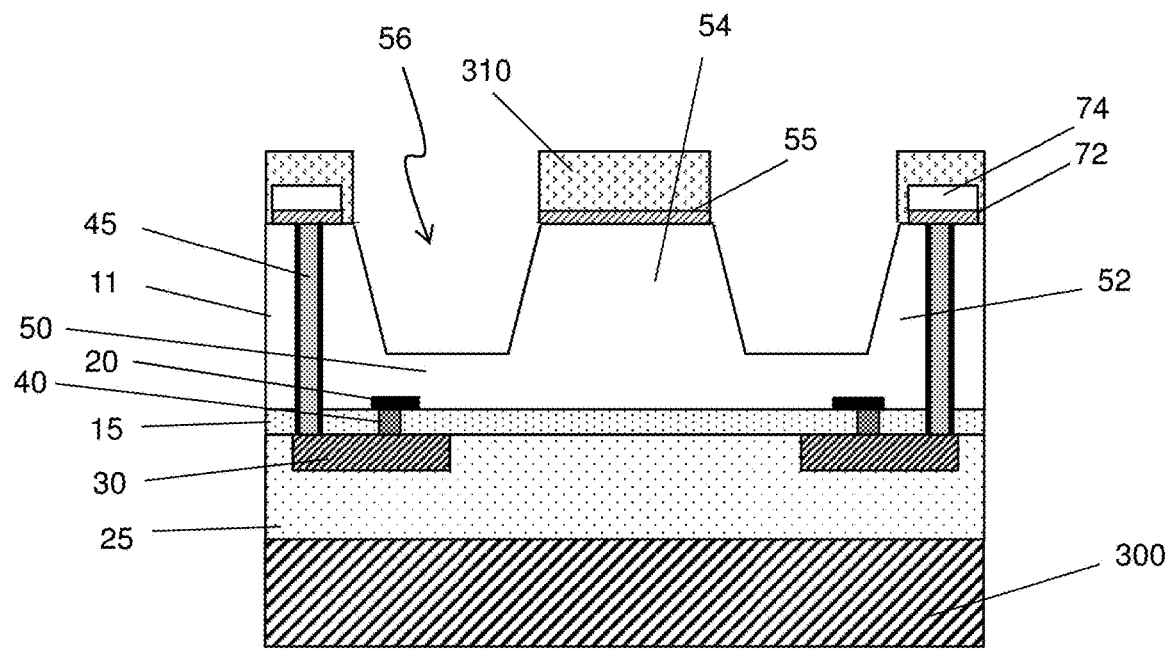

Then, as shown in FIG. 6B, by using the photo resist pattern 310 as an etching mask, the MEMS substrate 11 is etched to form a cavity 56, a frame portion 52, a weight portion 54 and a membrane portion 50. In some embodiments, dry etching and/or wet etching is utilized. In the case of wet etching, an etching solution can be tetramethylammonium hydroxide (TMAH).

Figure 7:
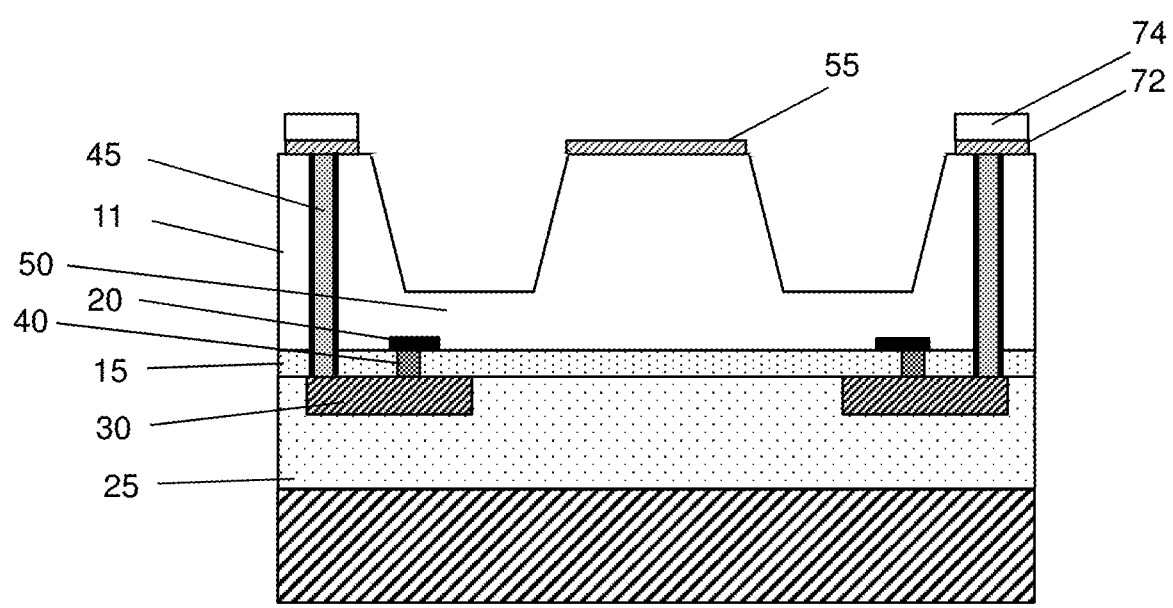
FIG. 7 shows one of the various stages of a manufacturing operation for a sensor device according to an embodiment of the present disclosure.

After the etching of the MEMS substrate 11, the photo resist layer 310 is removed and the structure shown in FIG. 7 is obtained. In other embodiments, the cavity 56 is formed by etching using a photo resist layer 310 before forming the electrode pad 74, the bottom electrode 72 and the first electrode 55.

Figure 8A:
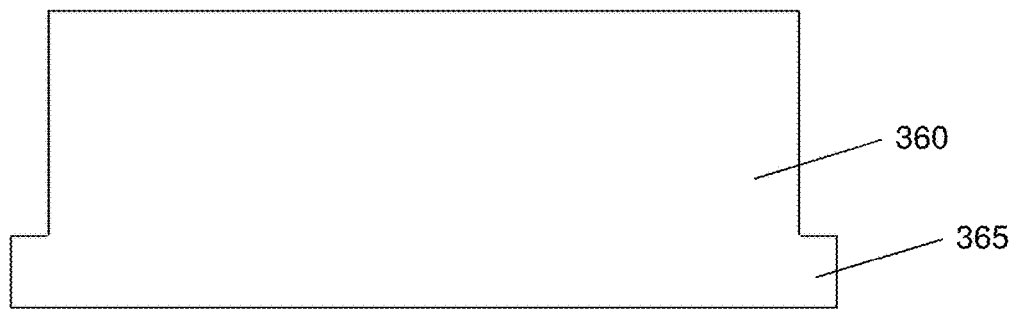
FIGS. 8A, 8B and 8C show various stages of a manufacturing operation for a sensor device according to an embodiment of the present disclosure.
Figure 8B:
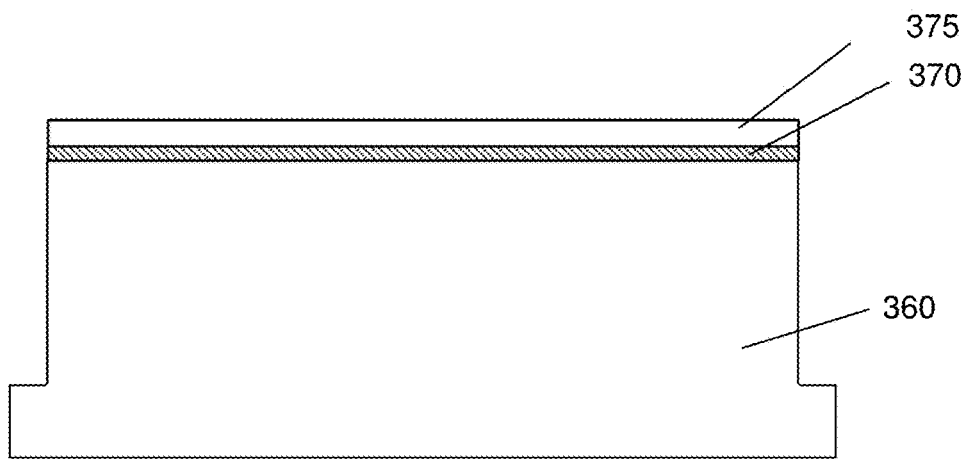
Figure 8C:
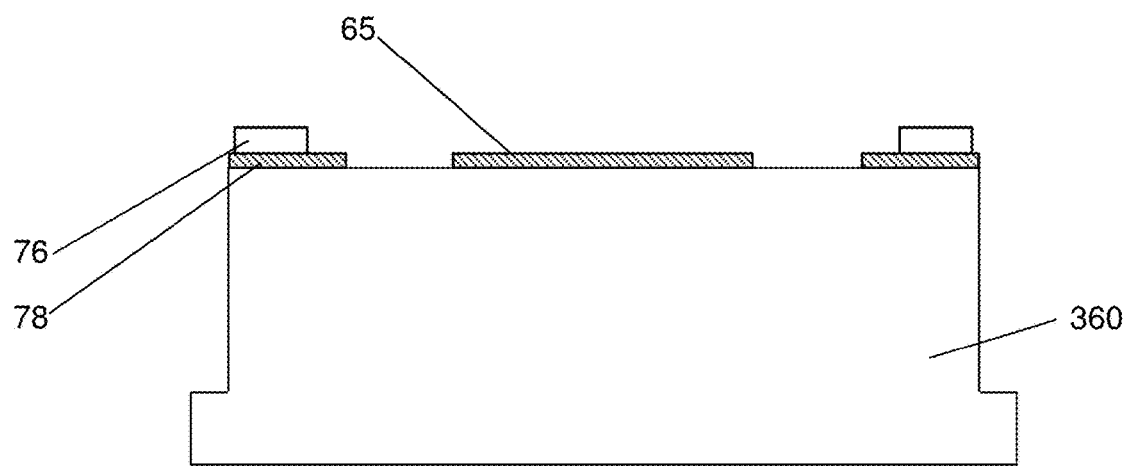

FIGS. 8A-8C show various stages of manufacturing operations for a capacitive sensor side structure.

As shown in FIG. 8A, a capacitive sensor side substrate 360 is provided. The capacitive sensor side substrate 360 is Si in some embodiments. In certain embodiments, the capacitive sensor side substrate 360 is p-type Si, and in other embodiments, the capacitive sensor side substrate 360 is n-type Si. The thickness of the capacitive sensor side substrate 360 is in a range from about 300 µm to about 1000 µm in some embodiments. In some embodiments, the edge of the capacitive sensor side substrate 360 is trimmed to form a handling portion 365, as shown in FIG. 8A.

Then, a third conductive layer 370 for a second electrode 65 for the capacitor of the capacitive sensor and capacitive sensor side electrodes 78 is formed over a main surface of the capacitive sensor side substrate 360 as shown in FIG. 8B. Further, a fourth conductive layer 375 for an electrode pad 76 is formed on the third conductive layer 370 as shown in FIG. 8B.

In some embodiments, the third conductive layer for the second electrode 55 and the capacitive sensor side electrodes 78 include TiN having a thickness in a range from about 50 nm to about 200 nm. The fourth conductive layer 375 for the electrode pad 76 includes Al, AlCu and/or Cu having a thickness in a range from about 300 nm to 800 nm in some embodiments. In other embodiments, the fourth conductive layer for the electrode pad 76 includes Ge. The third and fourth conductive layers can be formed by CVD, PVD or electro plating.

Subsequently, the fourth conductive layer 375 is patterned to form the electrode pad 76 by using one or more lithography operations and etching operations, and then the third conductive layer 375 is patterned to form the second electrode 65 and the capacitive sensor side electrodes 78 by using one or more lithography operations and etching operations, as shown in FIG. 8C.

Figure 9:
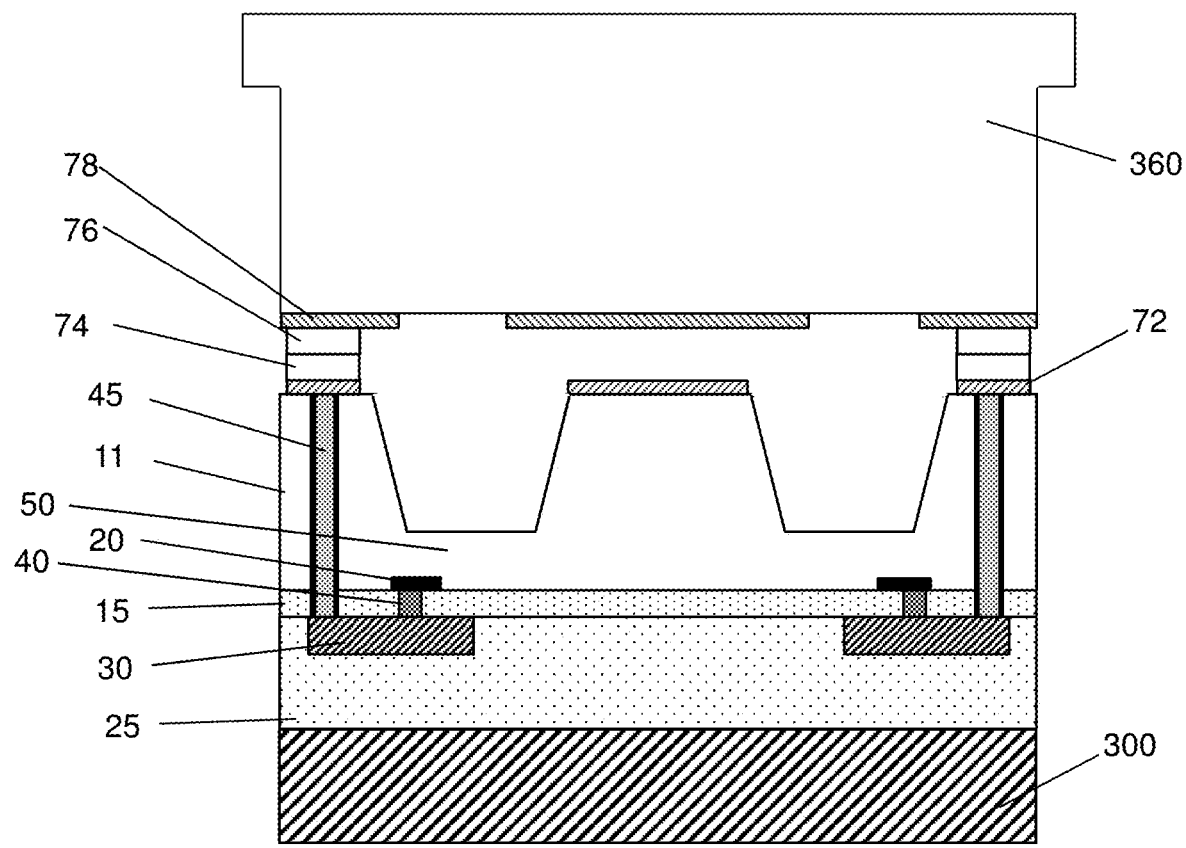
FIG. 9 shows one of the various stages of a manufacturing operation for a sensor device according to an embodiment of the present disclosure.

Then, the MEMS side structure shown in FIG. 7 and the capacitive sensor side structure shown in FIG. 8C are bonded together as shown in FIG. 9. In the bonding, the electrode pad 74 of the MEMS side structure is eutectic bonded to the electrode pad 76 of the capacitive sensor side structure.

Then, the rear side of the capacitive sensor side substrate 360 is thinned so that the thickness of the capacitive sensor side substrate 360 is in a range from about 100 µm to 300 µm in some embodiments. Then, the dummy substrate 300 is detached. Thus, the sensor devices 1-3 shown in FIGS. 1A-3 can be obtained.

FIGS. 10A-18B show various stages of manufacturing operations for a sensor device in accordance with another embodiment of the present disclosure. It is understood that additional operations can be provided before, during, and after the processes shown by FIGS. 10A-18B, and some of the operations described below can be replaced or eliminated, for additional embodiments of the method. The order of the operations/processes may be interchangeable. Material, configuration, dimensions and/or processes the same as or similar to the foregoing embodiments described with FIGS. 1A-9 may be employed in the following embodiments, and detailed explanation thereof may be omitted.

Figure 10A:
FIGS. 10A, 10B, 10C and 10D show various stages of a manufacturing operation for a sensor device according to another embodiment of the present disclosure.

As shown in FIG. 10A, a first insulating layer 1100 is formed on the surface of the MEMS substrate 1011. In some embodiments, the first insulating layer 1100 is a silicon oxide layer formed by thermal oxidation. In other embodiments, the first insulating 1100 can be formed by CVD. The thickness of the first insulating layer 1100 is in a range from about 5 nm to about 20 nm in some embodiments. The thermal oxidation can be dry oxidation or wet oxidation. The first insulating layer 1100 is formed on both front surface and rear surface of the MEMS substrate 1011 in some embodiments.

Figure 10B:
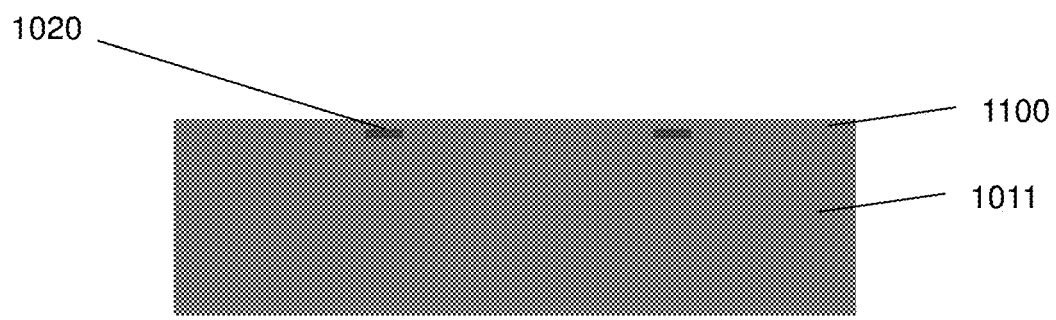

Then, as shown in FIG. 10B, a piezo-resistive element 1020 is formed on the front surface of the MEMS substrate 1011. The piezo-resistive element 1020 is an n-type region and can be formed by ion implantation by using a photo resist pattern (not shown) as a mask. In some embodiments, phosphorous (P) is implanted into the surface of the MEMS substrate 1011.

Figure 10C:
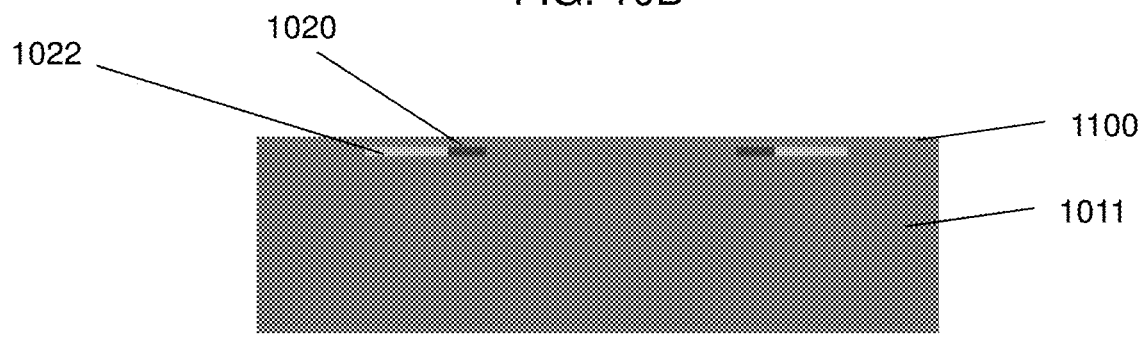

Further, as shown in FIG. 10C, an inter-connect region 1022 connected to the piezo-resistive element 1020 is formed. The inter-connect region 1022 is also an n-type region more highly doped than the piezo-resistive element 1020. The inter-connect region 1022 can be formed by ion implantation by using a photo resist pattern (not shown) as a mask. In some embodiments, phosphorous (P) is implanted into the surface of the MEMS substrate 1011.

Figure 10D:
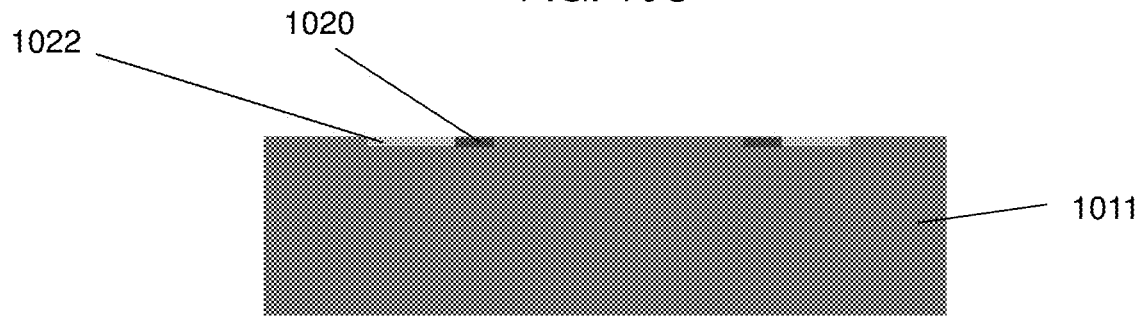

After the ion implantation operations, the first insulating layer 1100 is removed by, for example, wet etching using dilute HF, as shown in FIG. 10D.

Figure 11A:
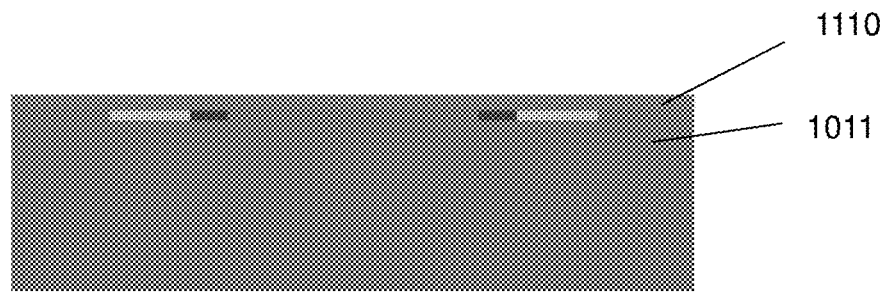
FIGS. 11A, 11B, 11C and 11D show various stages of a manufacturing operation for a sensor device according to another embodiment of the present disclosure.

Then, as shown in FIG. 11A, a second insulating layer 1110 is formed on the front surface of the MEMS substrate 1011. The second insulating layer 1110 can be formed by CVD. In some embodiments, the second insulating layer 1110 is a tetraethyl orthosilicate (TEOS) layer. The thickness of the second insulating layer 1110 is in a range from about 100 nm to about 300 nm in some embodiments.

Figure 11B:
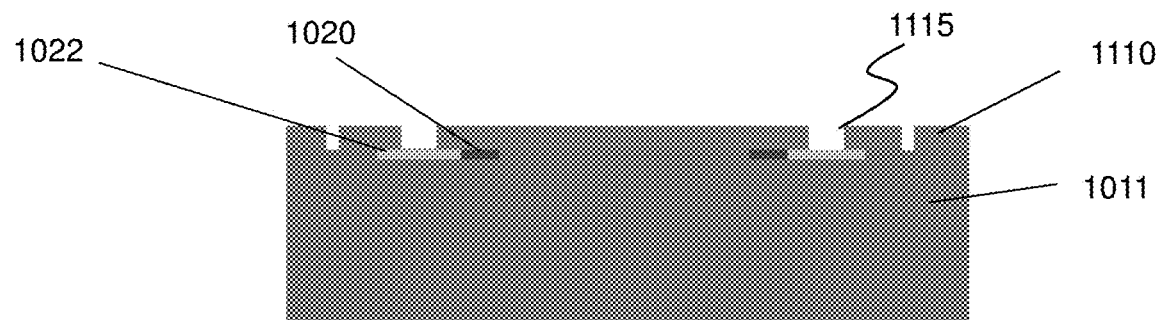

By using one or more lithography operations and etching operations, contact openings 1115 are formed in the second insulating layer 1110, as shown in FIG. 11B.

Figure 11C:
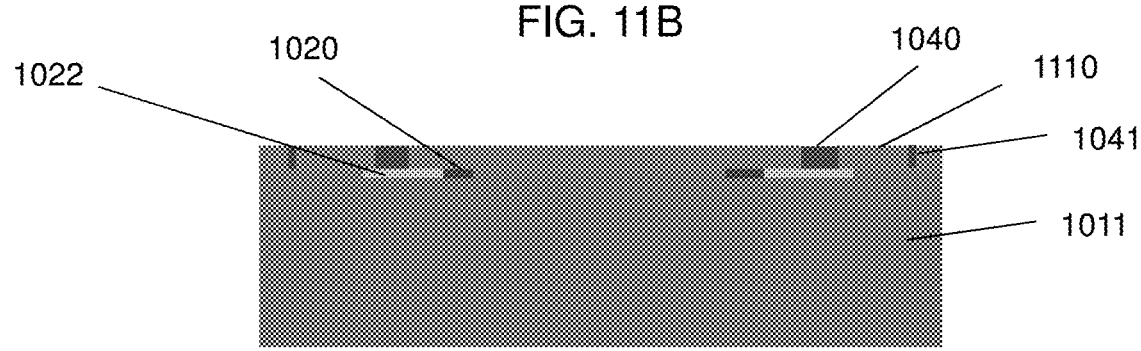

Subsequently, a conductive material is filled in the contact opening 1115, thereby forming via conductors 1040 and 1041, as shown in FIG. 11C. The conductive material includes one or more of W, Cu and Al in some embodiments. In certain embodiments, before forming a W layer, a Ti layer having a thickness in a range from about 20 nm to about 40 nm for a seed layer and a TiN layer having a thickness in a range from about 5 nm to about 20 nm for a barrier layer are formed on the front surface of the MEMS substrate 1011. The conductive material is formed by CVD, physical vapor deposition (PVD) including sputtering or electro plating and a planarization operation, such as chemical mechanical polishing (CMP) is performed to remove excess material formed on the surface of the second insulating layer 1110.

Figure 11D:
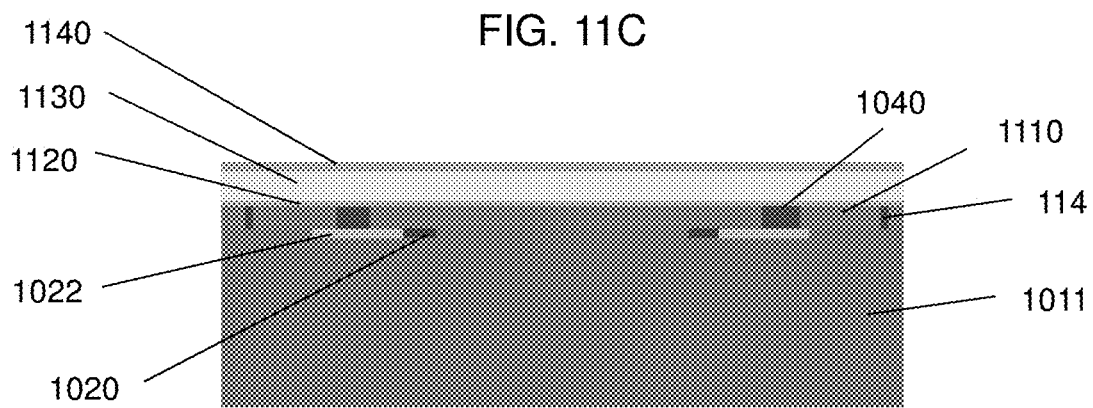

Then, as shown in FIG. 11D, one or more conductive layers for front wiring patterns are formed over the second insulating layer 1110. In some embodiments, a bottom layer 1120 such as TiN is formed on the second insulating layer 1110, a main metal layer 1130 such as AlCu, Al or Cu is formed on the bottom layer 1120, and an upper layer 1140 such as TiN is formed on the main metal layer 1130. The thickness of the bottom layer 1120 is in a range from about 30 nm to about 70 nm, the thickness of the main metal layer 1130 is in a range from about 600 nm to about 1000 nm and the thickness of the upper layer 1140 is in a range from about 80 nm to about 120 nm, in some embodiments.

Figure 12A:
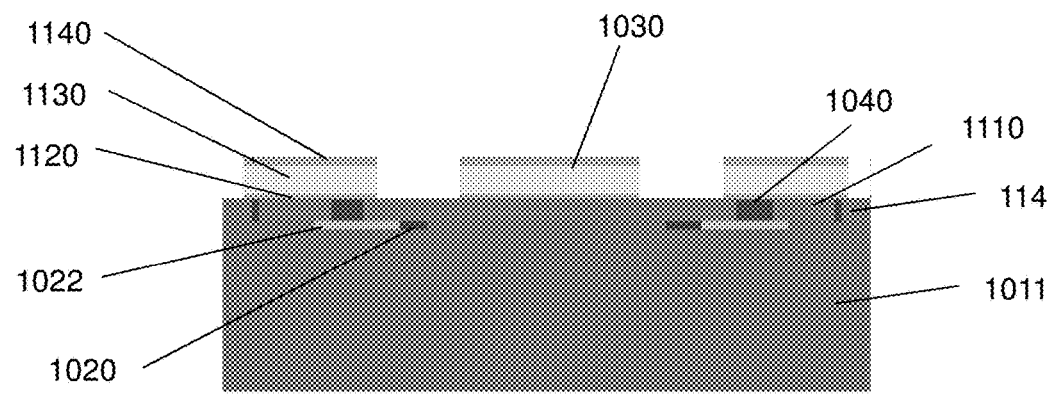
FIGS. 12A, 12B and 12C show various stages of a manufacturing operation for a sensor device according to another embodiment of the present disclosure.

Further, as shown in FIG. 12A, the conductive layers are patterned to form the front wiring patterns 1030.

Figure 12B:
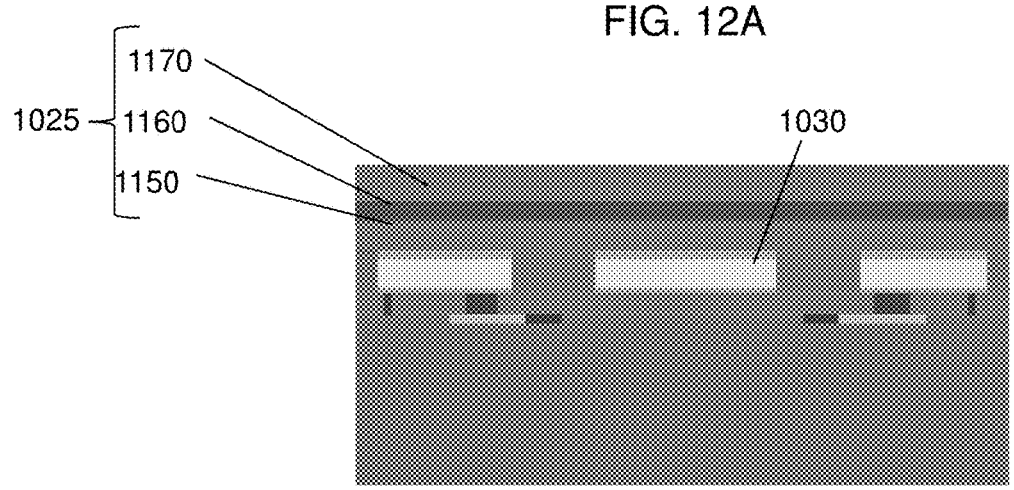

Further, a passivation layer 1025 is formed as shown in FIG. 12B. In some embodiments, the passivation layer 1025 includes a bottom insulating layer 1150, a middle insulating layer 1160 and an upper insulating layer 1170. The bottom insulating layer 1150 includes silicon oxide, the middle insulating layer 1160 includes silicon nitride and the upper insulating layer 1170 includes silicon oxide, in some embodiments. Each layer of the passivation layer 1025 can be formed by CVD. The thickness of the bottom insulating layer 1150 is in a range from about 300 nm to about 700 nm, the thickness of the middle insulating layer 1160 is in a range from about 200 nm to about 400 nm and the thickness of the upper insulating layer 1170 is in a range from about 300 nm to about 700 nm, in some embodiments.

In certain embodiments, one or more planarization operations, such as CMP is performed during the formation of the passivation layer 1025.

Figure 12C:
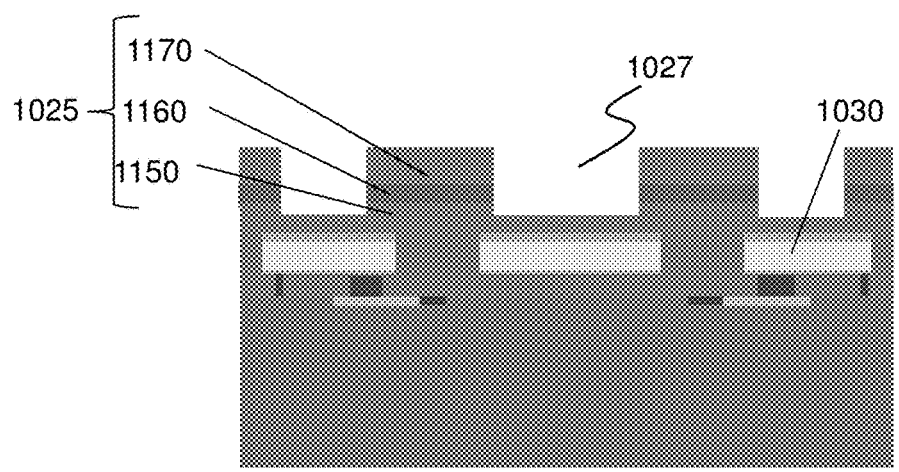

In some embodiments, as shown in FIG. 12C, a part of the passivation layer 1025 is patterned to form one or more window openings 1027 over the front wiring patterns 1030. In some embodiments, the remaining thickness of the bottom insulating layer 1150 over the front wiring patterns 1030 at the window opening 1027 is in a range from about 200 nm to about 400 nm in some embodiments.

Figure 13A:
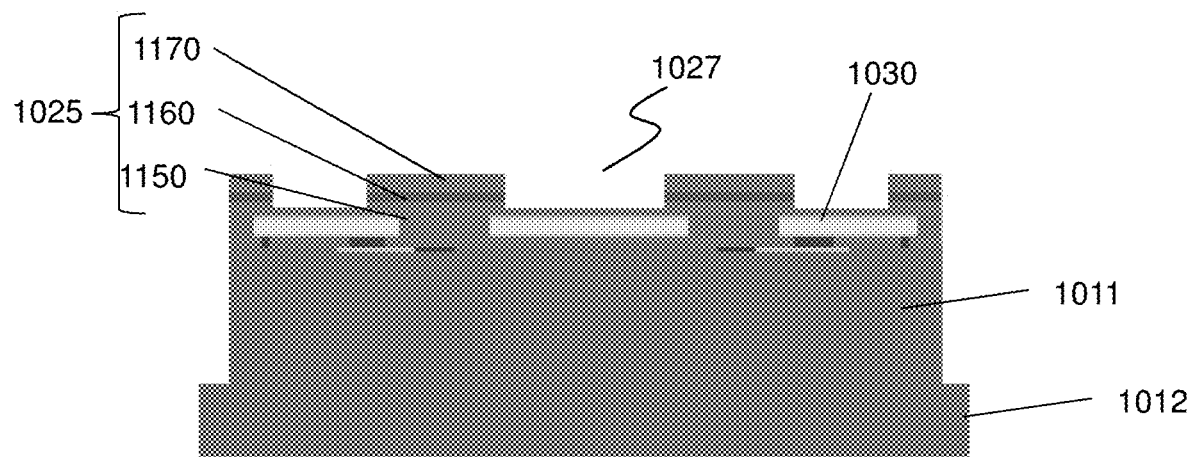
FIGS. 13A and 13B show various stages of a manufacturing operation for a sensor device according to another embodiment of the present disclosure.

Further, in some embodiments, the edge of the MEMS substrate 1011 is trimmed to form a handling portion 1012, as shown in FIG. 13A.

Figure 13B:
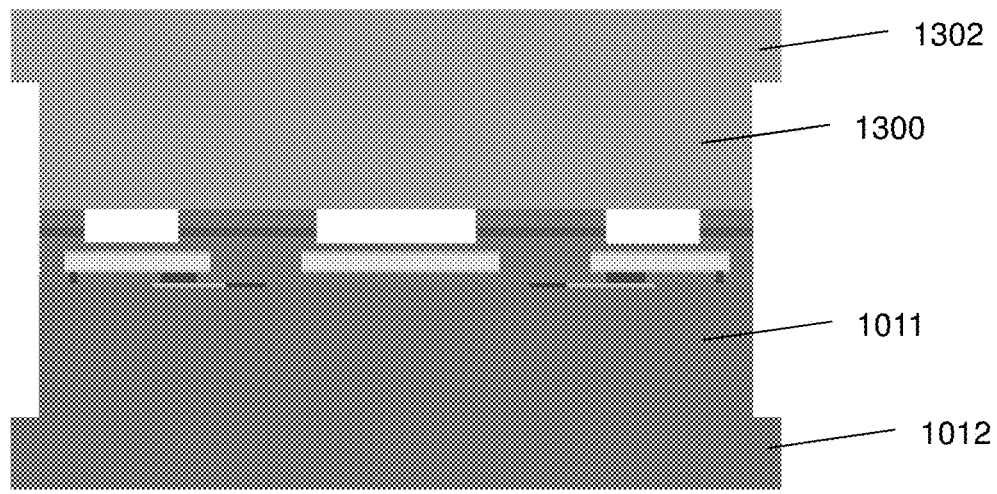

Then, as shown in FIG. 13B, a dummy substrate 1300 having a handling portion 1302 is attached to the front of the MEMS substrate 1011. In some embodiments, the dummy substrate 1300 is a Si substrate bonded to the upper insulating layer 1170 of the passivation layer 1025 by fusion bonding. In certain embodiments, an annealing operation at a temperature in a range from about 250° C. to 350° C. is performed.

Figure 14A:
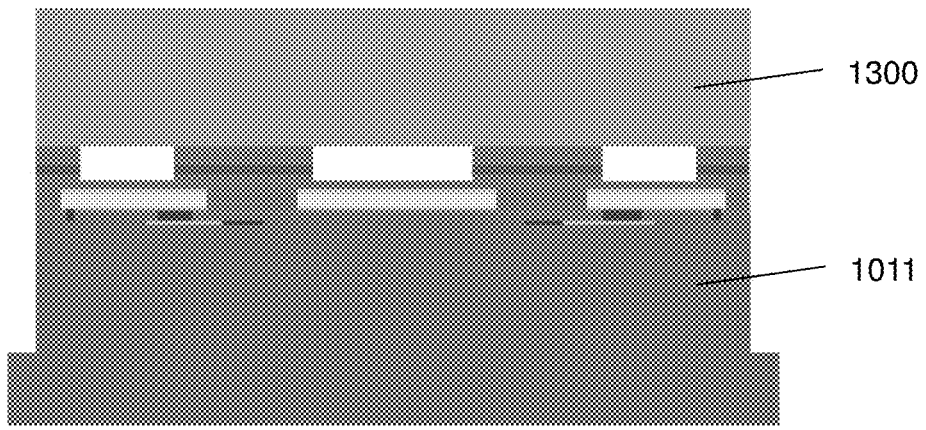
FIGS. 14A and 14B show various stages of a manufacturing operation for a sensor device according to another embodiment of the present disclosure.
Figure 14B:
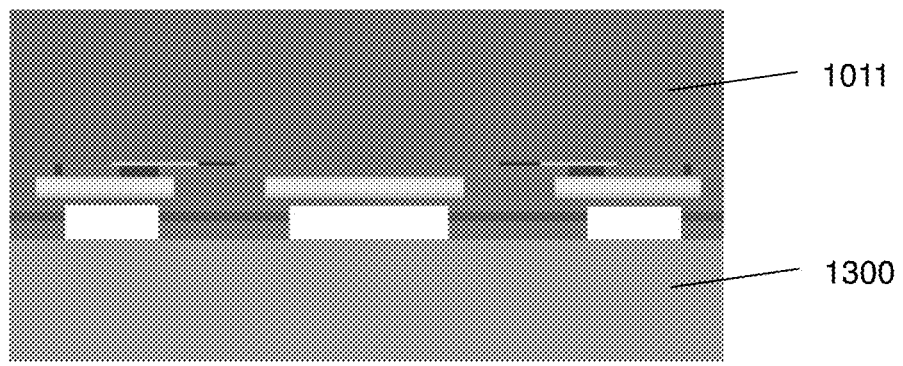

After the dummy substrate 1300 is attached, the dummy substrate 1300 is thinned to have a thickness in a range from about 200 µm to 400 µm in some embodiments, as shown in FIG. 14A. Further, the substrate is flipped and then the MEMS substrate 1011 is thinned to have a thickness in a range from about 200 µm to 400 µm in some embodiments. The thinning operation can be performed by a grinding method or any other suitable methods.

In addition, the MEMS substrate 1011 is patterned to form a cylindrical hollow passing through the MEMS substrate 1011 by one or more lithography and etching operations, thereby forming a conductive pillar 1045. Then, the cylindrical hollow is filled with an insulating material 1044. The insulating material can be silicon oxide. The insulating material is formed by CVD and a planarization operation, such as chemical mechanical polishing (CMP), is performed to remove excess material formed on the rear surface of the MEMS substrate 1011.

Figure 15A:
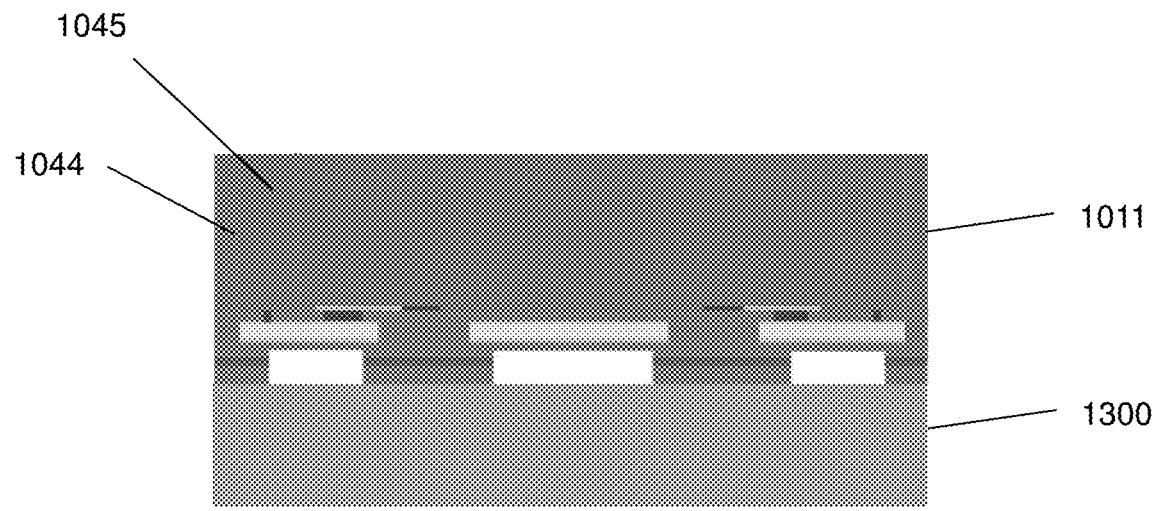
FIGS. 15A and 15B show various stages of a manufacturing operation for a sensor device according to another embodiment of the present disclosure.
Figure 15B:
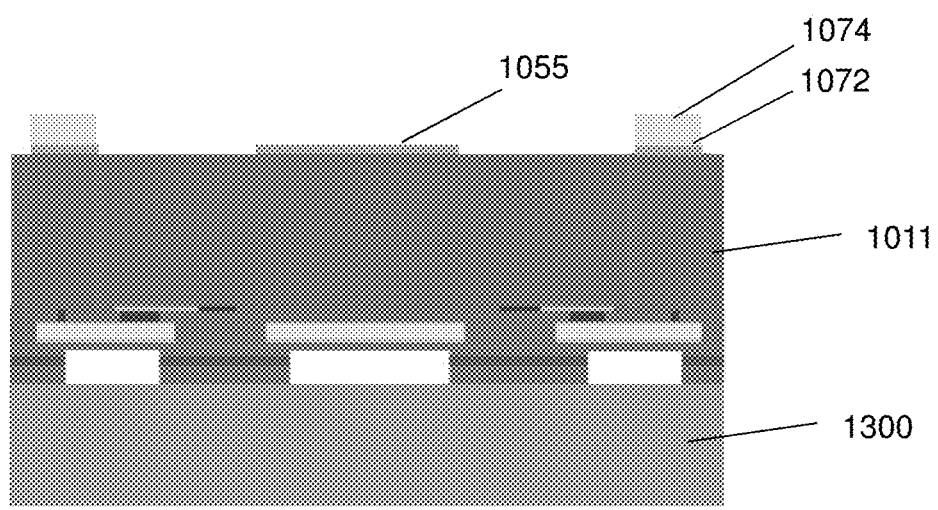

Subsequently, as shown in FIG. 15B, a first electrode 1055 for a capacitor of a capacitive sensor, a bottom electrode 1072 and an electrode pad 1074 are formed on the rear surface of the MEMS substrate 1011. In some embodiments, a blanket layer of a first conductive layer for the first electrode 1055 and the bottom electrode 1072 is formed on the rear surface of the MEMS substrate 1011 and a blanket layer of a second conductive layer for the electrode pad 1074 is formed on the first conductive layer. Then, the second conductive layer is patterned to form the electrode pad 1074 by using one or more lithography operations and etching operations, and then the first conductive layer is patterned to form the first electrode 1055 and the bottom electrode 1072 by using one or more lithography operations and etching operations.

In some embodiments, the first conductive layer for the first electrode 1055 and the bottom electrode 1072 includes TiN having a thickness in a range from about 50 nm to about 200 nm. The second conductive layer for the electrode pad 1074 includes Al, AlCu and/or Cu having a thickness in a range from about 500 nm to 1200 nm in some embodiments. The first and second conductive layers can be formed by CVD, PVD or electro plating.

Figure 16A:
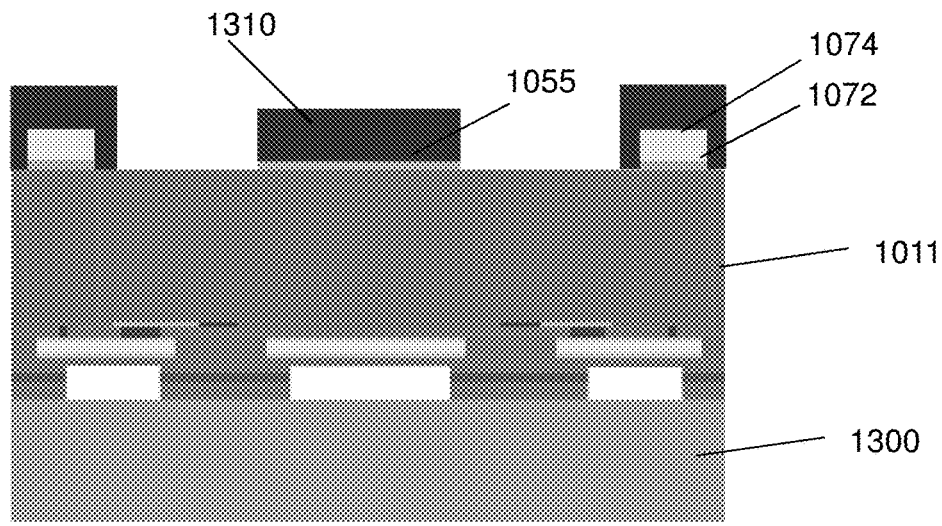
FIGS. 16A and 16B show various stages of a manufacturing operation for a sensor device according to another embodiment of the present disclosure.

Subsequently, a photo resist layer 1310 is formed on the rear surface of the MEMS substrate 1011 to cover the electrode pad 1074, the bottom electrode 1072 and the first electrode 1055, as shown in FIG. 16A.

Figure 16B:
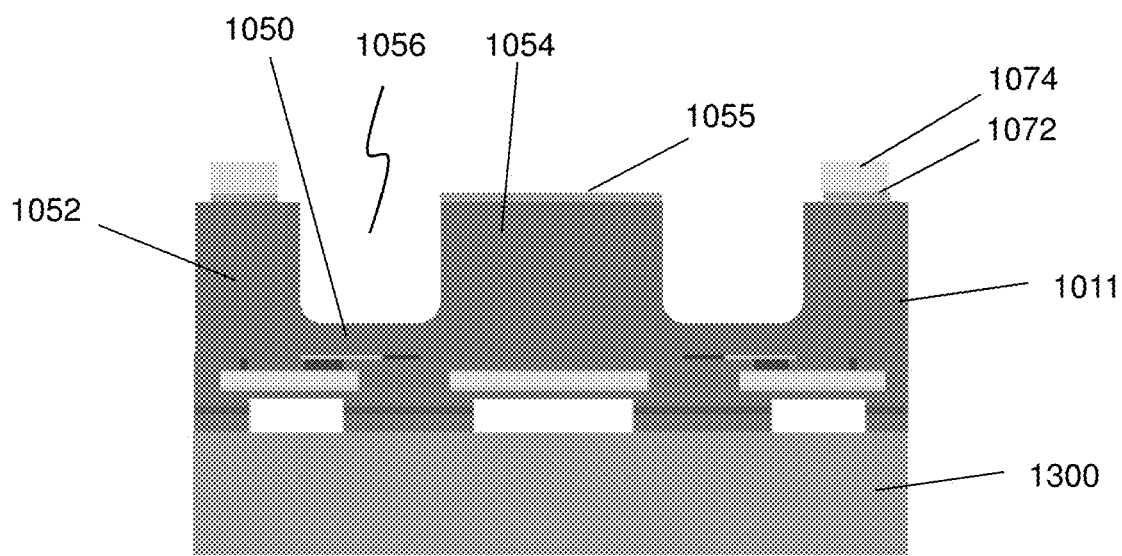

Then, as shown in FIG. 16B, by using the photo resist pattern 1310 as an etching mask, the MEMS substrate 1011 is etched to form a cavity 1056, a frame portion 1052, a weight portion 1054 and a membrane portion 1050. In some embodiments, dry etching and/or wet etching is utilized. In the case of wet etching, an etching solution can be tetramethylammonium hydroxide (TMAH). After the etching of the MEMS substrate 1011, the photo resist layer 1310 is removed and the structure shown in FIG. 16B is obtained. In other embodiments, the cavity 1056 is formed by etching using a photo resist layer 1310 before forming the electrode pad 1074, the bottom electrode 1072 and the first electrode 1055.

Figure 17A:
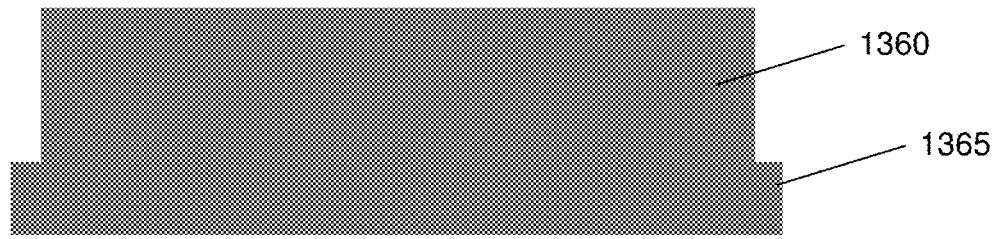
FIGS. 17A, 17B and 17C show various stages of a manufacturing operation for a sensor device according to another embodiment of the present disclosure.
Figure 17B:
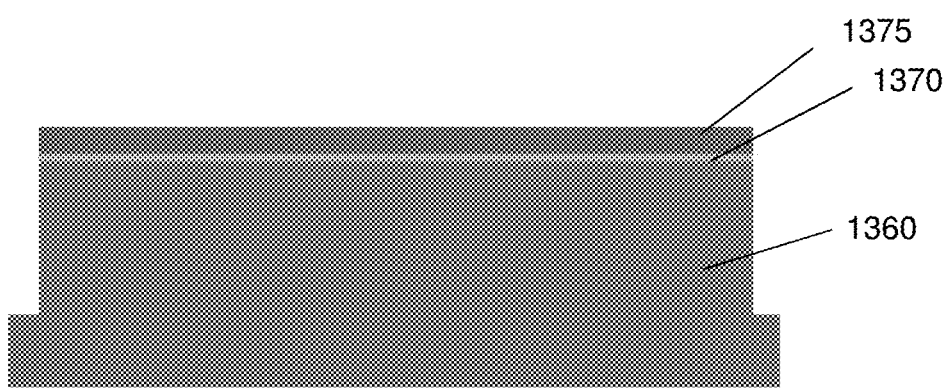
Figure 17C:
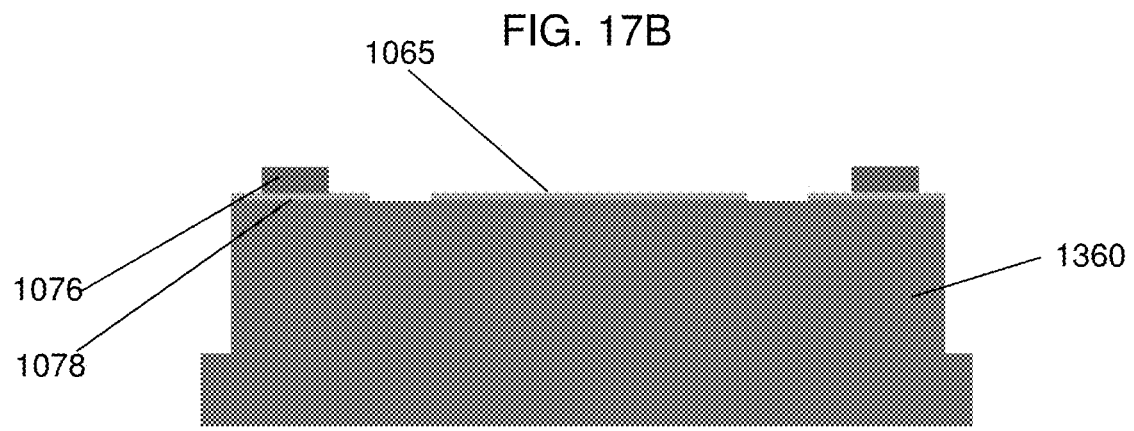

FIGS. 17A-17C show various stages of manufacturing operations for a capacitive sensor side structure.

As shown in FIG. 17A, a capacitive sensor side substrate 1360 is provided. The capacitive sensor side substrate 1360 is Si in some embodiments. In certain embodiments, the capacitive sensor side substrate 1360 is p-type Si, and in other embodiments, the capacitive sensor side substrate 1360 is n-type Si. The thickness of the capacitive sensor side substrate 1360 is in a range from about 300 µm to about 1000 µm in some embodiments. In some embodiments, the edge of the capacitive sensor side substrate 1360 is trimmed to form a handling portion 1365, as shown in FIG. 17A.

Then, a third conductive layer 1370 for a second electrode 1065 for the capacitor of the capacitive sensor and capacitive sensor side electrodes 1078 is formed over a main surface of the capacitive sensor side substrate 1360 as shown in FIG. 17B. Further, a fourth conductive layer 1375 for an electrode pad 1076 is formed on the third conductive layer 1370 as shown in FIG. 17B.

In some embodiments, the third conductive layer for the second electrode 1065 and the capacitive sensor side electrodes 1078 includes TiN having a thickness in a range from about 50 nm to about 200 nm. The fourth conductive layer for the electrode pad 1076 includes Al, AlCu and/or Cu having a thickness in a range from about 300 nm to 800 nm in some embodiments. In other embodiments, the fourth conductive layer for the electrode pad 1076 includes Ge. The third and fourth conductive layers can be formed by CVD, PVD or electro plating.

Subsequently, the fourth conductive layer 1375 is patterned to form the electrode pad 1076 by using one or more lithography operations and etching operations, and then the third conductive layer 1375 is patterned to form the second electrode 1065 and the capacitive sensor side electrodes 1078 by using one or more lithography operations and etching operations, as shown in FIG. 17C.

Figure 18A:
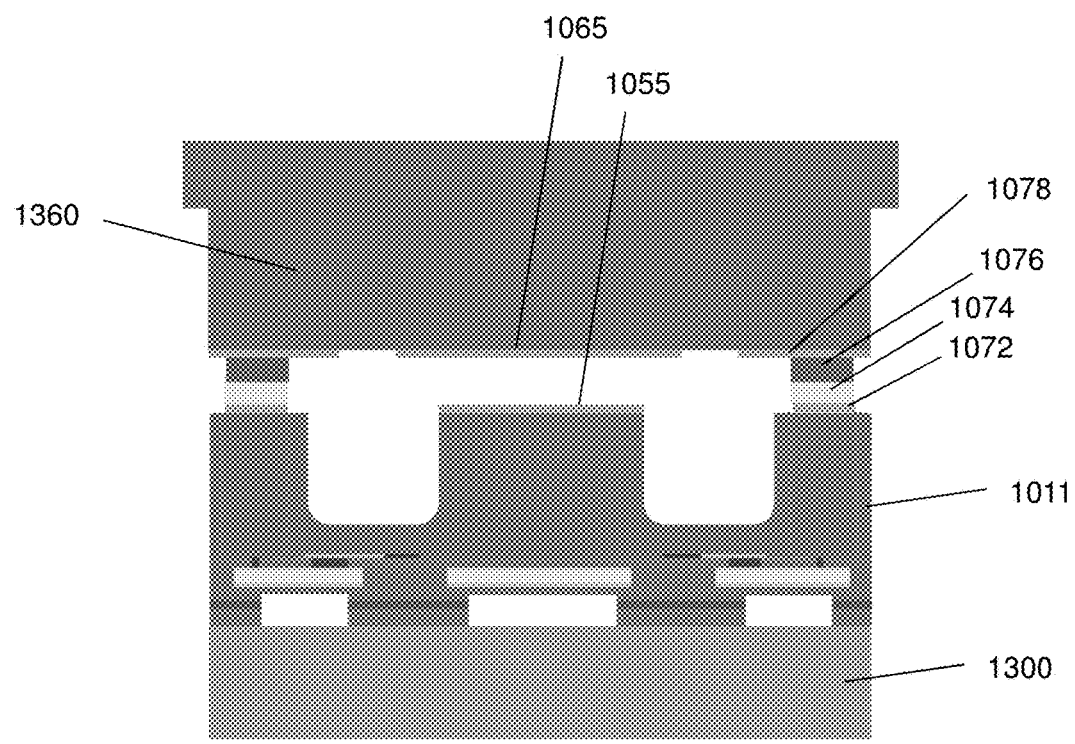
FIGS. 18A and 18B show various stages of a manufacturing operation for a sensor device according to another embodiment of the present disclosure.

Then, the MEMS side structure shown in FIG. 16C and the capacitive sensor side structure shown in FIG. 17C are bonded together as shown in FIG. 18A In the bonding, the electrode pad 1074 of the MEMS side structure is eutectic bonded to the electrode pad 1076 of the capacitive sensor side structure.

Then, the rear side of the capacitive sensor side substrate 1360 is thinned so that the thickness of the capacitive sensor side substrate 1360 is in a range from about 100 µm to 300 µm in some embodiments. Further, the remaining bottom insulating layer 1050 over the front wiring patterns in the window opening is removed. Then, the dummy substrate 1300 is detached, as shown in FIG. 18B.

Figure 18B:
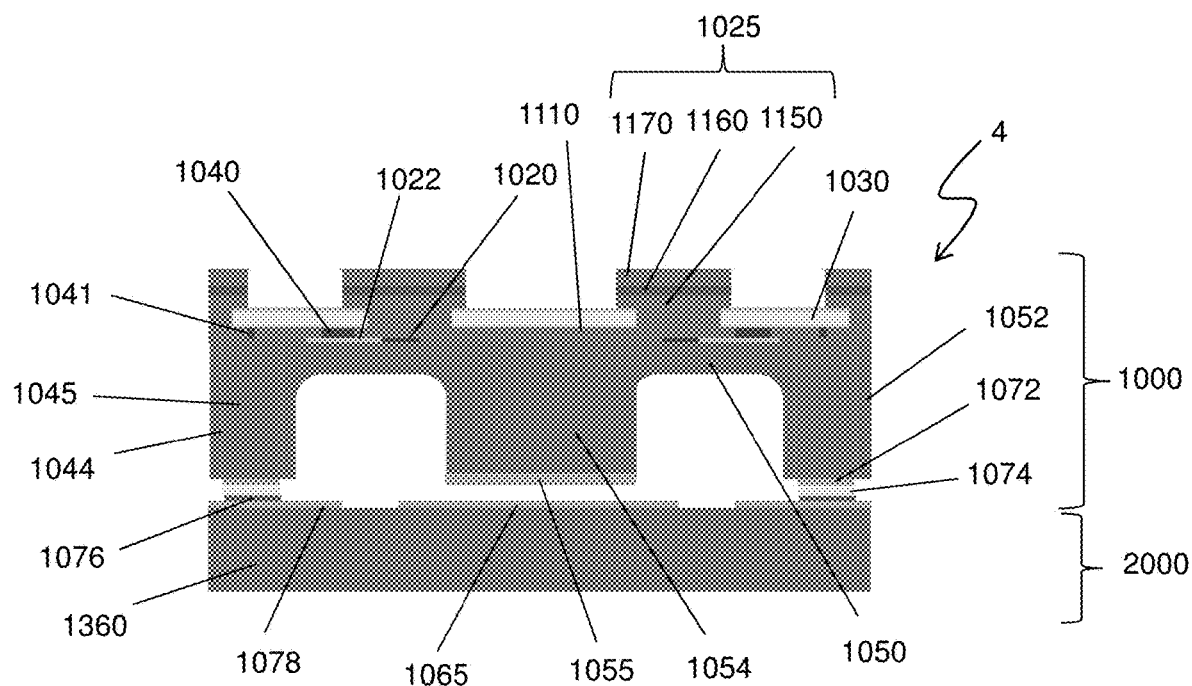

The sensor device 4 shown in FIG. 18B is substantially similar to the sensor devices 1-3 shown in FIGS. 1A-3. The sensor device 4 includes a MEMS sensor 1000 and a capacitive sensor 2000.

In some embodiments, the MEMS sensor 1000 is a piezo-resistive force sensor, and includes a frame portion 1052, a membrane portion (e.g., a diaphragm) 1050, a piezo-resistive element 1020 disposed in the membrane portion 1050, a cavity 1056 disposed below the membrane portion 1050 and surrounded by the frame portion 1052, and a center weight portion 1054 surrounded by the cavity 1056.

The piezo-resistive force sensor 1000 further includes a first insulating layer 1110 formed on the upper surface of the MEMS substrate, a passivation layer 1025, one or more front wiring patterns (e.g., electrodes) 1030 and one or more via conductors 1040 connecting the piezo-resistive element 1020 and the front wiring pattern 1030, in some embodiments. The passivation layer 1025 includes multiple layers (e.g., 1150, 1160 and 1170) in some embodiments. The piezo-resistive force sensor 1000 includes the piezo-resistive element 1020 and an inter-connect region 1022, and the inter-connection region is connected to the via conductor 1040.

The capacitive sensor 2000 includes a capacitor formed by a first electrode 1055 and a second electrode 1065. A space between the first electrode 1055 and the second electrode 1065 is in a range from about 0.5 µm to about 2 µm in some embodiments, and is in a range from about 0.8 µm to about 1.2 µm in other embodiments. In some embodiments, the second electrode 1065 is disposed on a main surface of a capacitive sensor side substrate 1360. One or more capacitive sensor side electrodes 1078 are also disposed on the main surface of the capacitive sensor side substrate 1360. The second electrode 1065 is electrically coupled to one of the capacitive sensor side electrodes 1078 in some embodiments. Further, an electrode pad 1076 is disposed on the capacitive sensor side electrode 1078.

In the MEMS substrate, a bottom electrode 1072 is disposed on the bottom surface of the frame portion 1052. In some embodiments, an electrode pad 1074 is disposed on the bottom electrode 1072. Further, a pillar 1045 as a conductive connector surrounded by an insulating layer 1044 passes through the frame portion 1052 is provided to electrically connect the front wiring pattern 1030 and the bottom electrode in some embodiments.

The electrode pad 1074 formed on the bottom of the piezo-resistive force sensor 1000 is connected to the electrode pad 1076 formed on the main surface of the capacitive sensor side substrate 1360.

According to the sensor device 4, pressure applied to the membrane and acceleration (force) can be measured by one device.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In the present disclosure, a sensor device includes a MEMS force sensor and a capacitive acceleration sensor integrally formed, and thus force (e.g., pressure) applied to the membrane and acceleration can be measured by one device.

In accordance with one aspect of the present disclosure, a sensor device includes a microelectromechanical system (MEMS) force sensor, and a capacitive acceleration sensor. In one or more of the foregoing and following embodiments, the MEMS force sensor and the capacitive acceleration sensor are electrically coupled to each other. In one or more of the foregoing and following embodiments, the capacitive acceleration sensor includes a capacitor having a first electrode and a second electrode facing the first electrode, and the first electrode is disposed on the bottom of the MEMS force sensor. In one or more of the foregoing and following embodiments, the MEMS force sensor includes a frame portion, a membrane portion, a piezo-resistive element disposed in the membrane portion, a cavity disposed below the membrane portion and surrounded by the frame portion, and a center weight portion surrounded by the cavity. In one or more of the foregoing and following embodiments, the first electrode is disposed on a bottom surface of the center weight portion. In one or more of the foregoing and following embodiments, the MEMS force sensor and the capacitive acceleration sensor are electrically coupled to each other by a bottom electrode disposed on a bottom of the frame portion. In one or more of the foregoing and following embodiments, the MEMS force sensor further includes a front electrode, and a conductive connector passing through the frame portion and connecting the front electrode and the bottom electrode. In one or more of the foregoing and following embodiments, the front electrode is electrically coupled to the piezo-resistive element. In one or more of the foregoing and following embodiments, the membrane portion is made of a semiconductor material. In one or more of the foregoing and following embodiments, the piezo-resistive element is a doped region of the semiconductor material. In one or more of the foregoing and following embodiments, the sensor device further includes a circuit electrically coupled to the MEMS force sensor and the capacitive acceleration sensor for receiving a signal from the MEMS force sensor and a signal from the capacitive acceleration sensor.

In accordance with another aspect of the present disclosure, a sensor device includes an MEMS sensor, and a capacitive sensor. The MEMS sensor includes a frame portion, a membrane portion, a piezo-resistive element disposed in the membrane portion, a cavity disposed below the membrane portion and surrounded by the frame portion, and a center weight portion surrounded by the cavity. The capacitive sensor includes a capacitor having a first electrode and a second electrode facing the first electrode. The first electrode is disposed on the bottom of the center weight portion, and the second electrode is disposed on a surface of a substrate attached to a bottom of the frame portion. In one or more of the foregoing and following embodiments, the MEMS sensor further includes a front electrode, and a conductive connector passing through the frame portion and connecting the front electrode and the bottom electrode. In one or more of the foregoing and following embodiments, the frame portion is made of a semiconductor material. In one or more of the foregoing and following embodiments, the conductive connector is a pillar made of a part of the semiconductor material and is separated from the frame portion by an insulating layer. In one or more of the foregoing and following embodiments, a conductive connector is made of a metallic material. In one or more of the foregoing and following embodiments, the metallic material is insulated from the frame portion. In one or more of the foregoing and following embodiments, the front electrode is electrically connected to the piezo-resistive element. In one or more of the foregoing and following embodiments, the sensor device further includes a circuit electrically coupled to the MEMS force sensor and the capacitive acceleration sensor for receiving a signal from the MEMS force sensor and a signal from the capacitive acceleration sensor. The front electrode is electrically coupled to the circuit.

In accordance with another aspect of the present disclosure, a sensor device includes an MEMS sensor, and a capacitive sensor. The MEMS sensor includes a frame portion, a membrane portion, piezo-resistive elements disposed in the membrane portion, a beam portion having a cross shape and connected to the frame portion, a weight portion connected to the beam, and cavities disposed below the membrane portion and surrounded by the frame portion and the beam portion. The capacitive sensor includes a capacitor having a first electrode and a second electrode facing the first electrode, and the first electrode is disposed on the bottom of the weight portion, and the second electrode is disposed on a surface of a substrate attached to a bottom of the frame portion.

In accordance with one aspect of the present disclosure, in a method of manufacturing a sensor device, a sensor portion of a microelectromechanical system (MEMS) pressure sensor is prepared over a front surface of a first substrate. The sensor portion includes a piezo-resistive element and a front electrode. A bottom electrode and a first electrode are formed on a back surface of the first substrate. A second substrate having an electrode pad and a second electrode to the bottom of the first substrate are attached such that the bottom electrode is connected to the electrode pad and the first electrode faces the second electrode with a space. In one or more of the foregoing and following embodiments, a cavity and a membrane portion are further formed by etching the back surface of the first substrate. In one or more of the foregoing and following embodiments, the membrane portion is made of a semiconductor material. In one or more of the foregoing and following embodiments, the piezo-resistive element is a doped region of the semiconductor material. In one or more of the foregoing and following embodiments, a through-hole passing through the first substrate is further formed, and a conductive material is formed in the through-hole, thereby forming a conductive connector. The front electrode is connected to the conductive connector, and the bottom electrode is formed to be connected to the conductive connector. In one or more of the foregoing and following embodiments, the bottom electrode is connected to the electrode pad by eutectic bonding. In one or more of the foregoing and following embodiments, the front electrode is electrically coupled to the piezo-resistive element. In one or more of the foregoing and following embodiments, a height of the second electrode from a main surface of the substrate is smaller than a height of the electrode pad from the main surface. In one or more of the foregoing and following embodiments, a protective layer is further formed to cover at least the membrane portion, and a support substrate is attached to the protective layer. In one or more of the foregoing and following embodiments, after the MEMS sensor is attached to the part of the capacitive sensor, the support substrate is removed.

In accordance with another aspect of the present disclosure, in a method of manufacturing a sensor device, an MEMS sensor is prepared. The MEMS sensor includes a frame portion, a membrane portion, a piezo-resistive element disposed in the membrane portion, a cavity disposed below the membrane portion and surrounded by the frame portion, and a center weight portion surrounded by the cavity. A bottom electrode is formed on a bottom of the frame portion and a first electrode is formed on a bottom of the center weight portion. A part of a capacitive sensor is prepared, which includes a substrate, a second electrode disposed on a main surface of the substrate and an electrode pad disposed on the main surface. The MEMS sensor and the part of the capacitive sensor are attached such that the bottom electrode is connected to the electrode pad and the first electrode faces the second electrode with a space therebetween, thereby forming a capacitor of the capacitive sensor. In one or more of the foregoing and following embodiments, the bottom electrode is connected to the electrode pad by eutectic bonding. In one or more of the foregoing and following embodiments, the membrane portion is made of a semiconductor material. In one or more of the foregoing and following embodiments, the piezo-resistive element is a doped region of the semiconductor material. In one or more of the foregoing and following embodiments, in the preparing the MEMS sensor, a through-hole passing through the first substrate is formed, a conductive material is formed in the through-hole, thereby forming a conductive connector, and the first electrode and the bottom electrode are formed to be connected to the conductive connector. In one or more of the foregoing and following embodiments, a protective layer is formed to cover at least the membrane portion, and a support substrate is attached to the protective layer. In one or more of the foregoing and following embodiments, after the MEMS sensor is attached to the part of the capacitive sensor, the support substrate is removed. In one or more of the foregoing and following embodiments, in the preparing the MEMS sensor, a cylindrical hollow passing through the first substrate is formed, an insulating material is formed in the cylindrical hollow, thereby forming a conductive pillar made of a part of the semiconductor material, and the first electrode and the bottom electrode are formed to be connected to the conductive pillar. In one or more of the foregoing and following embodiments, a height of the second electrode from the main surface is smaller than a height of the electrode pad from the main surface.

In accordance with another aspect of the present disclosure, in a method of manufacturing a sensor device, an MEMS sensor is prepared. The MEMS sensor includes a frame portion, a membrane portion, piezo-resistive elements disposed in the membrane portion, a beam portion having a cross shape and connected to the frame portion, a weight portion connected to the beam portion, and cavities disposed below the membrane portion and surrounded by the frame portion and the beam portion. A bottom electrode is formed on a bottom of the frame portion and a first electrode is formed on a bottom of the weight portion. A part of a capacitive sensor is formed, which includes a substrate, a second electrode disposed on a main surface of the substrate and an electrode pad disposed on the main surface. The MEMS sensor and the part of the capacitive sensor are attached such that the bottom electrode is connected to the electrode pad and the first electrode faces the second electrode with a space therebetween, thereby forming a capacitor of the capacitive sensor.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a sensor device, the method comprising:
    preparing a sensor portion of a microelectromechanical system (MEMS) force sensor over a front surface of a first substrate, the sensor portion including a piezo-resistive element and a front electrode;
    forming a bottom electrode and a first electrode on a back surface of the first substrate;
    after the first electrode and the bottom electrode are formed, forming a cavity and a membrane portion by etching the back surface of the first substrate; and
    attaching a second substrate having an electrode pad and a second electrode to a bottom of the first substrate such that the bottom electrode is connected to the electrode pad and the first electrode faces the second electrode with a space therebetween, wherein:
    the membrane portion is made of a semiconductor material,
    the piezo-resistive element is a doped region of the semiconductor material formed by an ion implantation process, and
    the method further comprises forming an interconnect region having different conductivity type from the doped region of the piezo-resistive element.

2. The method of claim 1, wherein the membrane portion is a remaining part of the first substrate.

3. The method of claim 1, wherein the membrane portion is made of silicon.

4. The method of claim 1 wherein the piezo-resistive element is an n-type doped region.

5. The method of claim 1, further comprising, before the cavity is formed:
forming a through-hole passing through the first substrate; and
forming a conductive material in the through-hole, thereby forming a conductive connector, wherein:
the front electrode is connected to the conductive connector, and
the bottom electrode is connected to the conductive connector.

6. The method of claim 1, wherein the bottom electrode is connected to the electrode pad by eutectic bonding.

7. The method of claim 1, wherein the front electrode is electrically coupled to the piezo-resistive element.

8. A method of manufacturing a sensor device, the method comprising:
preparing a microelectromechanical system (MEMS) sensor by:
forming a piezo-resistive element by an ion implantation process on a front surface of a semiconductor substrate;
forming a front electrode over the front surface of the semiconductor substrate;
forming a through-hole passing through the semiconductor substrate by etching;
forming a conductive material in the through-hole, thereby forming a conductive connector that is connected to the front electrode;
forming a bottom electrode connected to the conductive connector and a first electrode on a back surface of the semiconductor substrate;
after the first electrode and the bottom electrode are formed, etching the back surface of the semiconductor substrate, thereby forming a frame portion, a membrane portion, a cavity surrounded by the frame portion, and a center weight portion surrounded by the cavity, wherein the bottom electrode is formed on a bottom of the frame portion and the first electrode is formed on a bottom of the center weight portion;
preparing a part of a capacitive sensor including a substrate, a second electrode disposed on a main surface of the substrate and an electrode pad disposed on the main surface; and
attaching the MEMS sensor and the part of the capacitive sensor such that the bottom electrode is connected to the electrode pad and the first electrode faces the second electrode with a space therebetween, thereby forming a capacitor of the capacitive sensor.

9. The method of claim 8, wherein the bottom electrode is connected to the electrode pad by eutectic bonding.

10. The method of claim 8, wherein the preparing the MEMS sensor further comprises forming an interconnect region having different conductivity type from the piezo-resistive element.

11. The method of claim 10, wherein further comprising forming an insulating layer over the front surface of the semiconductor substrate,
wherein the front electrode is formed over the insulating layer.

12. The method of claim 10, wherein the forming the through-hole comprises:
forming a cylindrical hollow passing through the first substrate as the through-hole;
forming an insulating material in the cylindrical hollow, thereby forming a conductive pillar made of a part of the semiconductor material; and
forming the first electrode and the bottom electrode to be connected to the conductive pillar.

13. The method of claim 8, further comprising, before the conductive material is formed in the through-hole, forming an insulating layer on inner wall of the through-hole by chemical vapor deposition (CVD), thermal oxidation or chemical oxidation.

14. The method of claim 8, further comprising, before the through-hole is formed:
forming a protective layer to cover at least the membrane portion; and
attaching a support substrate to the protective layer.

15. The method of claim 14, wherein, after the MEMS sensor is attached to the part of the capacitive sensor, the support substrate is removed.

16. The method of claim 8, wherein a height of the second electrode from the main surface is smaller than a height of the electrode pad from the main surface.

17. A method of manufacturing a sensor device, the method comprising:
preparing a microelectromechanical system (MEMS) sensor by:
forming piezo-resistive elements on a front surface of a semiconductor substrate;
forming a front electrode over the front surface of the semiconductor substrate;
forming a through-hole passing through the semiconductor substrate by etching;
forming a conductive material in the through-hole, thereby forming a conductive connector that is connected to the front electrode;
forming a bottom electrode connected to the conductive connector and a first electrode on a back surface of the semiconductor substrate;
after the first electrode and the bottom electrode are formed, etching the back surface of the semiconductor substrate, thereby forming a frame portion, a membrane portion, a beam portion having a cross shape and connected to the frame portion, a weight portion connected to the beam portion, and cavities surrounded by the frame portion and the beam portion, wherein a bottom electrode is formed on a bottom of the frame portion and a first electrode is formed on a bottom of the weight portion;
preparing a part of a capacitive sensor including a substrate, a second electrode disposed on a main surface of the substrate and an electrode pad disposed on the main surface; and
attaching the MEMS sensor and the part of the capacitive sensor such that the bottom electrode is connected to the electrode pad and the first electrode faces the second electrode with a space, thereby forming a capacitor of the capacitive sensor.

18. The method of claim 17, further comprising:
forming a protective layer to cover at least the membrane portion; and
attaching a support substrate to the protective layer.

19. The method of claim 17, wherein, after the MEMS sensor is attached to the part of the capacitive sensor, the support substrate is removed.

* * * * *